(12) United States Patent
Sandstrom et al.

(10) Patent No.: US 7,154,928 B2
(45) Date of Patent: Dec. 26, 2006

(54) LASER OUTPUT BEAM WAVEFRONT SPLITTER FOR BANDWIDTH SPECTRUM CONTROL

(75) Inventors: Richard L. Sandstrom, Encinitas, CA (US); Daniel J. W. Brown, San Diego, CA (US); Alexander I. Ershov, San Diego, CA (US); Igor V. Fomenkov, San Diego, CA (US); William N. Partlo, Poway, CA (US)

(73) Assignee: Cymer Inc., San Diego, CA (US)

(*) Notice: Subject to any disclaimer, the term of this patent is extended or adjusted under 35 U.S.C. 154(b) by 272 days.

(21) Appl. No.: 10/875,662

(22) Filed: Jun. 23, 2004

(65) Prior Publication Data

US 2005/0286598 A1    Dec. 29, 2005

(51) Int. Cl.
H01S 3/22 (2006.01)
H01S 3/223 (2006.01)
(52) U.S. Cl. ............................. 372/55; 372/56; 372/57
(58) Field of Classification Search ............ 372/55–54, 372/57
See application file for complete search history.

(56) References Cited

U.S. PATENT DOCUMENTS

| | | | |
|---|---|---|---|
| 4,223,279 A | 9/1980 | Bradford, Jr. et al. | 331/94.5 |
| 4,455,658 A | 6/1984 | Sutter et al. | 372/38 |
| 4,697,270 A | 9/1987 | Galkowski | 372/34 |
| 4,785,192 A | 11/1988 | Bruning | 250/548 |
| 4,798,467 A | 1/1989 | Wyeth et al. | 356/349 |
| 4,817,101 A | 3/1989 | Wyeth et al. | 372/32 |
| 4,823,354 A | 4/1989 | Znotins et al. | 372/57 |
| 4,869,999 A | 9/1989 | Fukuda et al. | 430/311 |
| 4,881,231 A | 11/1989 | Jain | 372/32 |
| 4,883,352 A | 11/1989 | Bruning | 353/122 |
| 4,937,619 A | 6/1990 | Fukuda et al. | 355/53 |
| 4,940,331 A | 7/1990 | Wyeth et al. | 356/349 |
| 4,959,840 A | 9/1990 | Akins et al. | 372/57 |
| 5,023,884 A | 6/1991 | Akins et al. | 372/57 |
| 5,025,445 A | 6/1991 | Anderson et al. | 372/20 |
| 5,025,446 A | 6/1991 | Kuizenga | 372/21 |
| 5,095,492 A | 3/1992 | Sandstrom | 372/102 |
| 5,128,601 A | 7/1992 | Orbach et al. | 372/29 |
| 5,189,678 A | 2/1993 | Ball et al. | 372/28 |

(Continued)

OTHER PUBLICATIONS

P. Kerkoc et al., "Molecular crystals for applications in acousto-optics" Phys. A: Math. Gen. 32, No. 20 (May 21, 1999).

(Continued)

*Primary Examiner*—Minsun Oh Harvey
*Assistant Examiner*—Delma R. Flores-Ruiz
(74) *Attorney, Agent, or Firm*—William Cray

(57) ABSTRACT

Apparatus/method providing bandwidth control in narrow band short pulse duration gas discharge laser output light pulse beam producing systems, producing a beam comprising pulses at selected pulse repetition races, e.g., comprising a dispersive bandwidth selection optic selecting at least one center wavelength for each pulse determined at least in part by the angle of incidence of the beam containing the respective pulse on the optic; a tuning mechanism operative to select at least one angle of incidence of the beam containing the respective pulse upon the optic; the tuning mechanism comprising a plurality of incidence angle selection elements each defining an angle of incidence for a different spatially separated but not temporally separated portion of the pulse to return from the optic a laser light pulse comprising a plurality of spatially separated but not temporally separated portions, each having one of at least two different selected center wavelengths.

64 Claims, 20 Drawing Sheets

U.S. PATENT DOCUMENTS

| | | | |
|---|---|---|---|
| 5,303,002 A | 4/1994 | Yan | 355/53 |
| 5,315,611 A | 5/1994 | Ball et al. | 372/56 |
| 5,371,587 A | 12/1994 | De Groot et al. | 356/349 |
| 5,373,515 A | 12/1994 | Wakabayashi et al. | 372/20 |
| 5,420,877 A | 5/1995 | Sandstrom | 372/34 |
| 5,440,578 A | 8/1995 | Sandstrom | 372/59 |
| 5,448,580 A | 9/1995 | Birx et al. | 356/349 |
| 5,471,965 A | 12/1995 | Kapich | 123/565 |
| 5,524,144 A | 6/1996 | Suzuki | 359/176 |
| 5,691,989 A | 11/1997 | Rakuljic | 372/20 |
| 5,706,301 A | 1/1998 | Lagerström | 372/32 |
| 5,754,571 A | 5/1998 | Endoh et al. | 372/20 |
| 5,835,512 A | 11/1998 | Wada et al. | 372/13 |
| 5,852,621 A | 12/1998 | Sandstrom | 372/25 |
| 5,856,991 A | 1/1999 | Ershov | 372/57 |
| 5,867,514 A | 2/1999 | Anderson | 372/38 |
| 5,870,420 A | 2/1999 | Webb | 372/58 |
| 5,953,360 A | 9/1999 | Vitruk et al. | 372/87 |
| 5,978,394 A | 11/1999 | Newman et al. | 372/32 |
| 5,978,405 A | 11/1999 | Juhasz et al. | 372/57 |
| 5,991,324 A | 11/1999 | Knowles et al. | 372/57 |
| 6,005,879 A | 12/1999 | Sandstrom et al. | 372/25 |
| 6,016,216 A | 1/2000 | Chang | 359/285 |
| 6,018,537 A | 1/2000 | Hofmann et al. | 372/25 |
| 6,067,311 A | 5/2000 | Morton et al. | 372/57 |
| 6,104,735 A | 8/2000 | Webb | 372/37 |
| 6,128,323 A | 10/2000 | Myers et al. | 372/38 |
| 6,133,986 A | 10/2000 | Johnson | 355/67 |
| 6,154,470 A | 11/2000 | Basting et al. | 372/19 |
| 6,164,116 A | 12/2000 | Rice et al. | 73/1.72 |
| 6,187,213 B1 | 2/2001 | Smith et al. | 216/28 |
| 6,208,674 B1 | 3/2001 | Webb et al. | 372/57 |
| 6,208,675 B1 | 3/2001 | Webb | 372/58 |
| 6,219,368 B1 | 4/2001 | Gorokov | 372/59 |
| 6,263,002 B1 | 7/2001 | Hsu et al. | 372/6 |
| 6,282,218 B1 | 8/2001 | Anderson | 372/38 |
| 6,348,357 B1 | 2/2002 | Sano | 438/16 |
| 6,404,536 B1 | 6/2002 | Lean et al. | 359/308 |
| 6,477,193 B1 | 11/2002 | Oliver et al. | 372/58 |
| 6,493,374 B1 | 12/2002 | Fomenkov et al. | 372/102 |
| 6,621,846 B1 * | 9/2003 | Sandstrom et al. | 372/57 |
| 6,671,294 B1 * | 12/2003 | Kroyan et al. | 372/20 |
| 6,721,340 B1 | 4/2004 | Fomenkov et al. | 372/25 |
| 6,757,316 B1 | 6/2004 | Newman et al. | 372/57 |
| 2002/0108398 A1 | 8/2002 | Smith et al. | 63/32 |
| 2005/0007600 A1 * | 1/2005 | Rafac | 356/519 |
| 2005/0083983 A1 * | 4/2005 | Sandstorm et al. | 372/55 |

OTHER PUBLICATIONS

E. Young et al., "Acousto-optics, deflectors, light modulation, modulators, bandwidth, design analysis, fabrication, impedance matching, light beams, wave interaction," IEEE, Proceedings, vol. 69, Jan. 1981, p. 54-64.

* cited by examiner

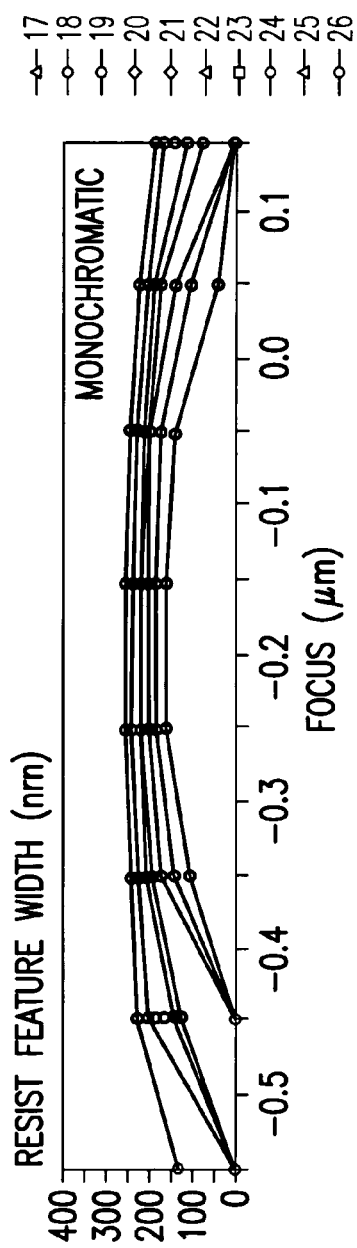
FIG. 2C1
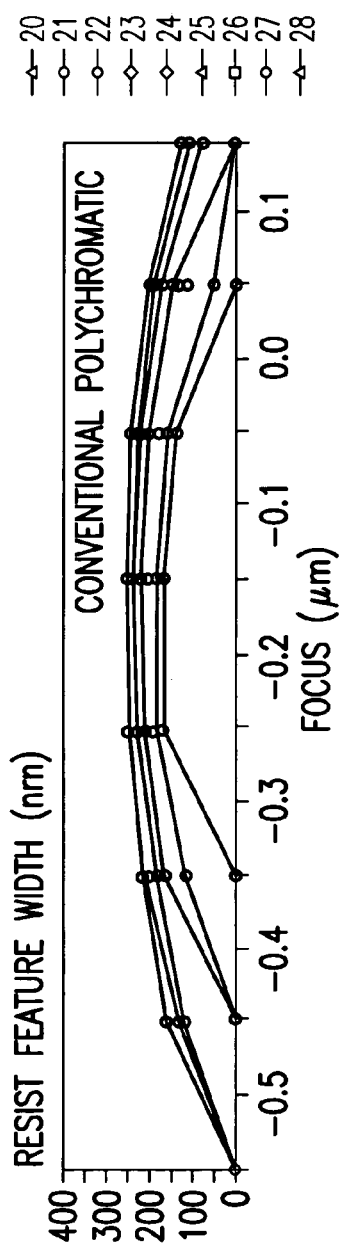
FIG. 2C2
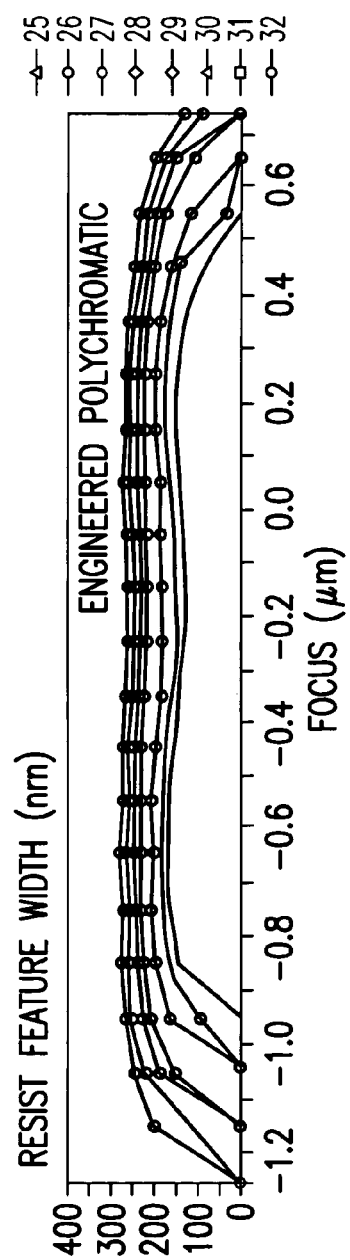
FIG. 2C3

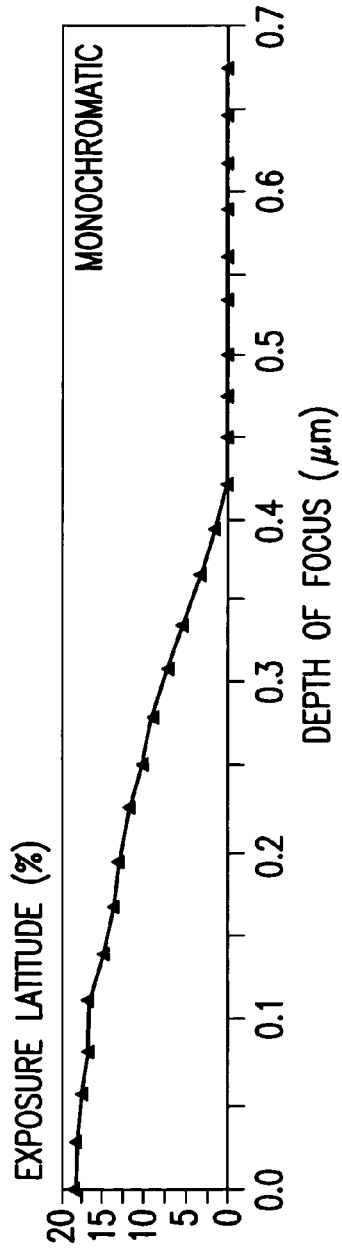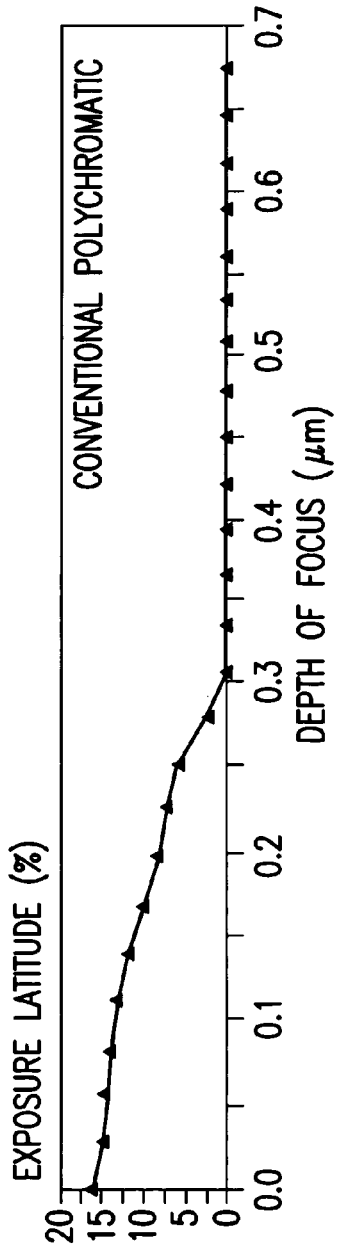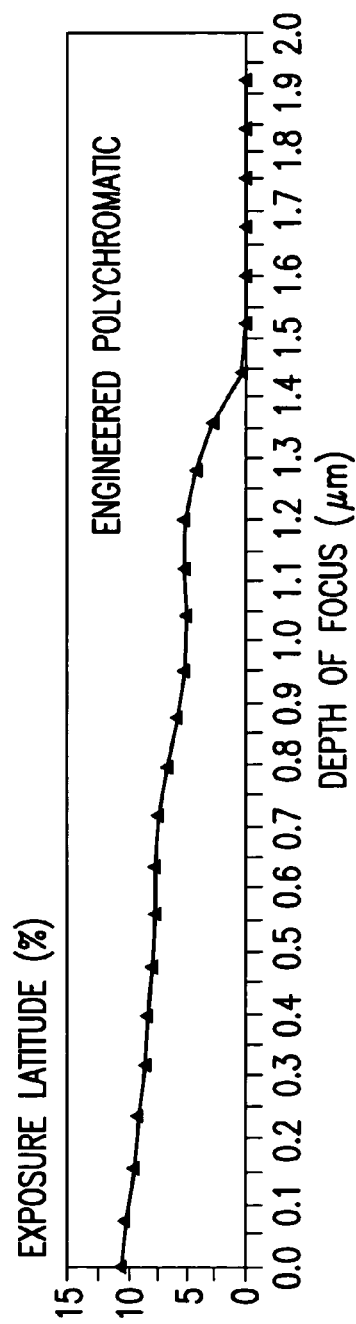

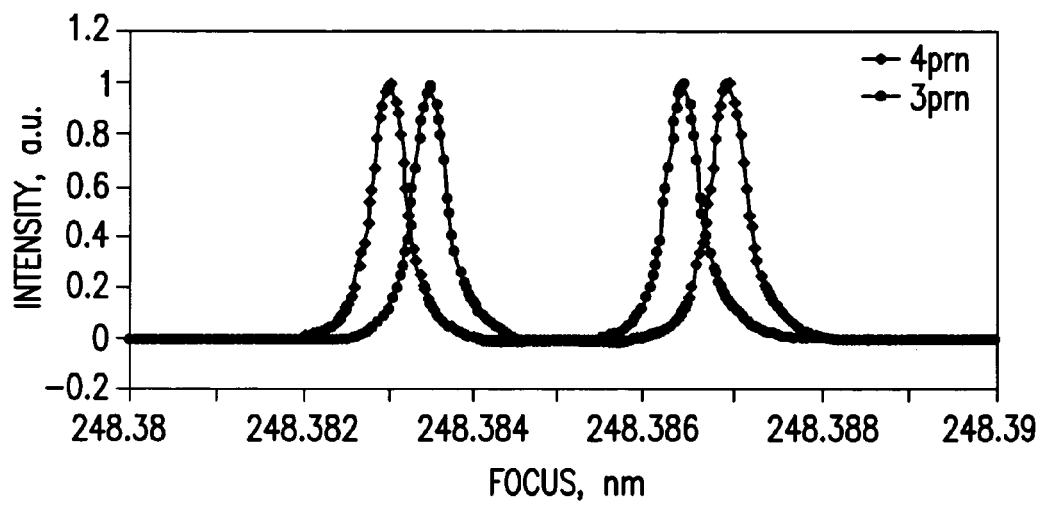
FIG.2G1
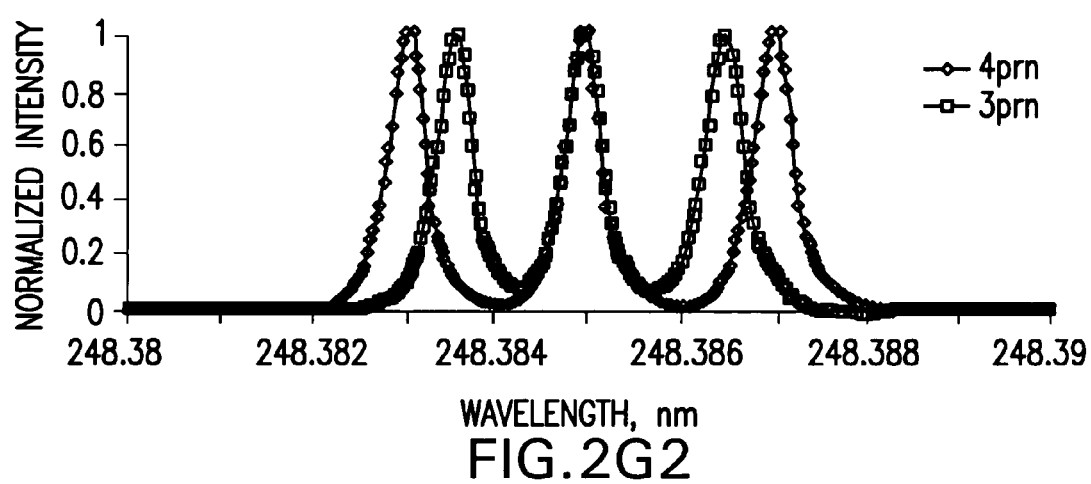
FIG.2G2
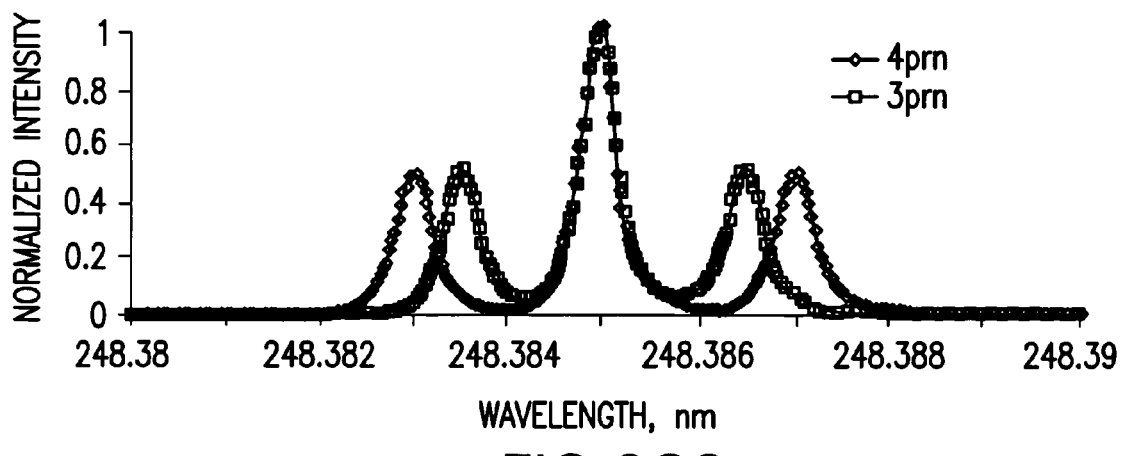
FIG.2G3

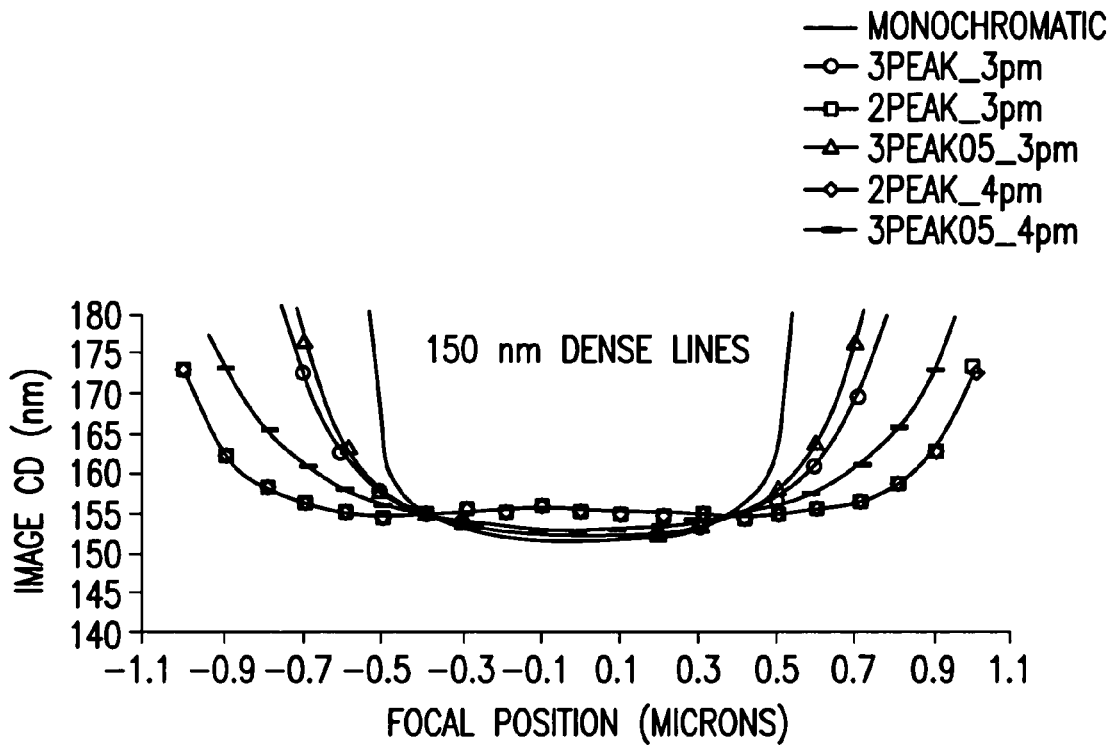
FIG.2H1
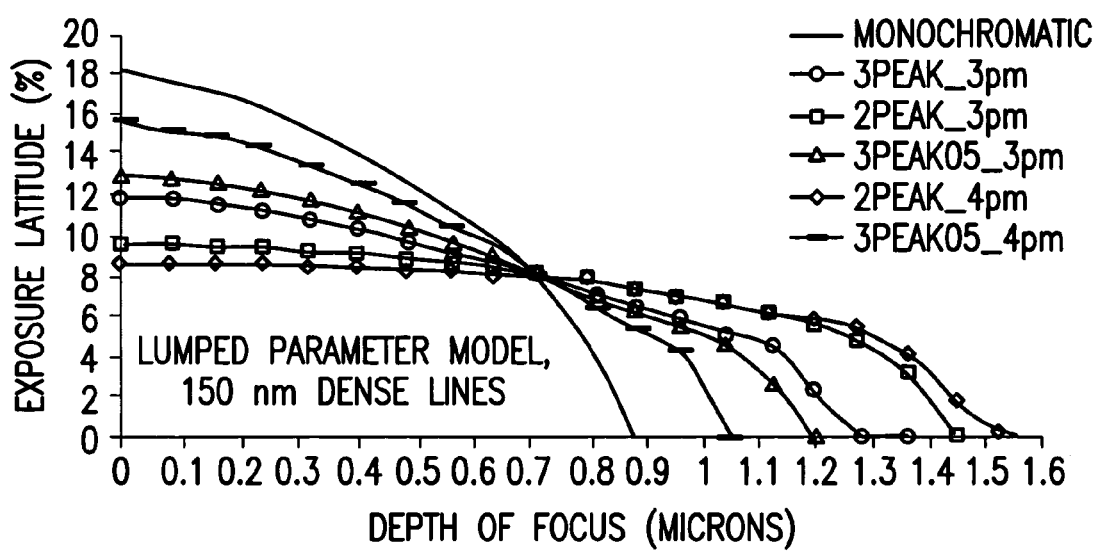
FIG.2H2

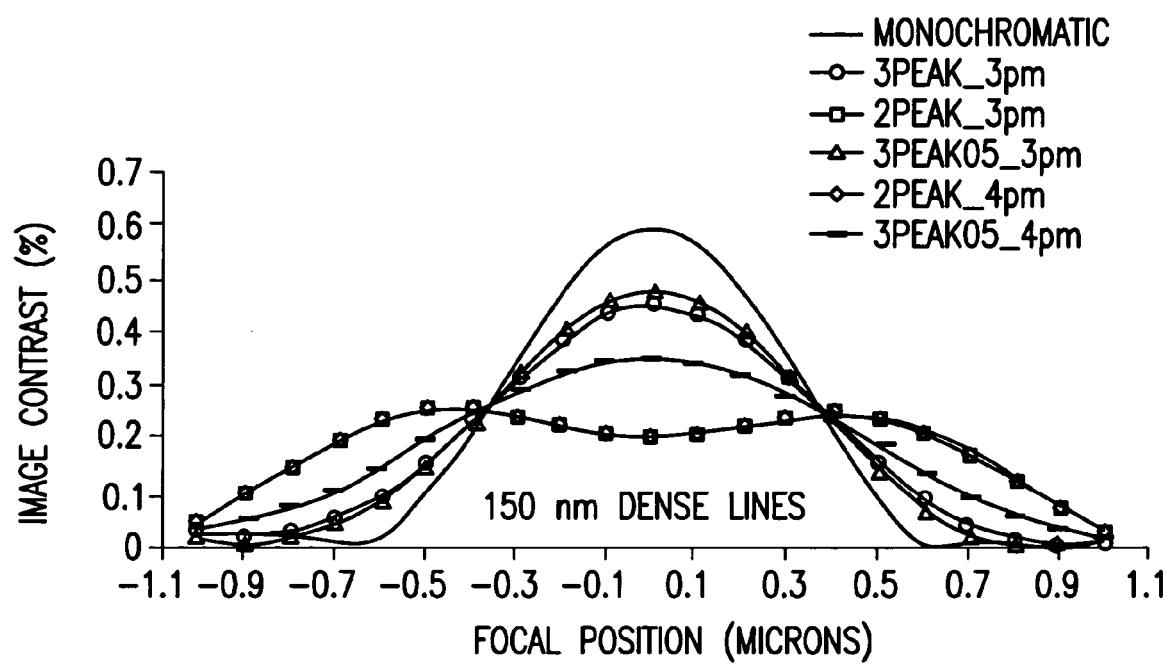
FIG.2H3

LASER OUTPUT BEAM WAVEFRONT SPLITTER FOR BANDWIDTH SPECTRUM CONTROL

FIELD OF THE INVENTION

The present invention relates to light sources, e.g., for integrated circuit lithography illumination sources requiring spectral engineering within a pulse or from pulse to pulse within a burst.

RELATED APPLICATIONS

The present application is related to Published Patent Application No. 2002/0167975A1, entitled LASER SPECTRAL ENGINEERING FOR LITHOGRAPHIC PROCESS, with inventors Spangler et al., published on Nov. 14, 2002, based on an application Ser. No. 10/036,925, filed on Dec. 21, 2001 ('925 Application"), and U.S. Pat. No. 6,671,294, issued to Kroyan et al. on Dec. 30, 2003, entitled LASER SPECTRAL ENGINEERING FOR LITHOGRAPHIC PROCESS, based on an application Ser. No. 09/918,773 filed on Jul. 27, 2001 ("294 patent"), the disclosures of which are hereby incorporated by reference.

BACKGROUND OF THE INVENTION

It is well known in the art of semiconductor manufacturing that depth of focus ("DOF") is an important issue. Fukuda (Hitachi Central Research Labs) proposed a method to increase DOF using FLEX (Focus Latitude Enhanced eXposure) in 1989, wherein the exposure is performed using two stage focal positions. This is discussed in U.S. Pat. No. 4,869,999, entitled METHOD OF FORMING PATTERN AND PROJECTION ALIGNER FOR CARRYING OUT THE SAME, issued to Fukuda, et al on Sep. 26, 1989 ("Fukuda I"), where the specification also notes that:

It has been found by the inventors' investigation that the effective focal depth of an exposure optical system can be increased by overlapping a plurality of light beams having image points at different positions on an optical axis, and thus the image of a mask pattern can be formed accurately in a region between the top and the bottom of the topography of a substrate surface. The term "image point" indicates a point on the conjugate plane of the mask pattern with respect to the exposure optical system. Accordingly, when an exposure operation for exposing a substrate coated with a resist layer to exposure light through a mask is performed a plurality of times at different positional relations in the direction of the optical axis between the resist layer and the image plane of a mask pattern, or when exposure operations at the different positional relations are simultaneously performed, the image of the mask pattern can be accurately formed not only at the top and the bottom of the topography of a substrate surface but also at an intermediate position between the top and the bottom of the topography. Thus, a fine pattern can be formed accurately all over the topography. (Col. 3, lines 33–54, emphasis added)

Fukuda I also states:

Furthermore, in the present embodiment, the image plane of a mask pattern was formed at two different positions in (or over) the substrate by displacing the substrate in the direction of an optical axis. Alternatively, the image plane of the mask pattern may be formed at different positions by moving a reticle having a mask pattern in the direction of the optical axis, by introducing a transparent material different in refractive index from air into an exposure optical system, by changing the atmospheric pressure in the whole or a portion of the exposure optical system, by using a lens having a multiple focal point, by overlapping light beams from a plurality of exposure optical systems which form the image plane of a mask pattern in different planes, or by using different wavelengths or a continuous wavelength in the same exposure optical system. (Col. 6, lines 37–53, emphasis added)

It has also been proposed, e.g., in systems sold, e.g., by Nikon that a stepper allow continuous stage motion between two focal planes.

In U.S. Pat. No. 4,937,619, entitled PROJECTION ALIGNER AND EXPOSURE METHOD, issued to Fukuda, et al. on Jun. 26, 1990 ("Fukuda II"), there is proposed a system in which separate laser beams are generated and optically combined to produce a single beam with a plurality of different wavelengths arriving at the reticle in the lithography tool at the same time. Fukuda II also notes:

FIG. 5 is a configuration diagram of a third embodiment of the present invention. The embodiment shown in FIG. 5 comprises a reflecting mirror 31, an etalon 32, an excimer laser gas cavity 33, an output mirror 34, a mirror 35, an etalon angle control circuit 36, a laser oscillation control circuit 37, an exposure wavelength control circuit 38, an illumination optical system 14, a reticle 15, a projection lens 16, a substrate stage 17, and various elements required for the projection aligner.

The etalon 32 narrows the bandwidth of the laser beam oscillated by the excimer laser resonator composed of a reflecting mirror 31, excimer laser gas cavity 33, and an output mirror 34, and changes the central wavelength of light narrowed in bandwidth by adjusting the angle of the etalon 32 minutely. The wavelength control circuit 38 sends a command to the etalon angle control circuit 36 to set the angle of the etalon at a predetermined value, and sends a command to the laser oscillation control circuit 37 to cause laser oscillation with a predetermined number of exposure pulses for the etalon angle. The exposure wavelength control circuit 38 is capable of changing the set angle of the etalon 32 during the exposure of one exposure region located on the substrate by using the above described function and is capable of performing projection exposure by using light having a plurality of different wavelengths. Since the projection lens 16 focuses the pattern on the reticle 15 onto a different position on an identical optical axis with respect to each of the above-described plurality of wavelengths, it is possible to perform the focus latitude enhancement exposure by using the present projection aligner.

Instead of being disposed between the reflecting mirror 31 and the laser resonator 33 as shown in FIG. 5, the etalon 32 and the wavelength control means may be disposed between the output mirror 34 and the laser gas cavity 33, or between the output mirror 34 and the illumination optical system 14, for example. Further, the above described line narrowing and wavelength alteration are not restricted to the method of changing the angle of the etalon.

The present embodiment is economically advantageous because only one excimer laser is used. In addition, lowering of laser output caused by bandwidth narrowing can be limited to a small value because the bandwidth-narrowing device is disposed between the reflecting mirror and the output mirror.

By using the present projection aligner, it was confirmed that the depth of focus of fine patterns increased in the same way as the first embodiment.

In U.S. Pat. No. 5,303,002, entitled METHOD AND APPARATUS FOR ENHANCING THE FOCUS LATI- TUDE IN LITHOGRAPHY, issued to Yan on Apr. 12 1994, there is proposed also combining separately generated laser beams to obtain a single beam at the reticle with a plurality of wavelengths. Yan also proposes the generation of three output beams from a single laser system, but the embodiment proposed is not workable.

In the prior applications assigned to applicant's assignee referenced above "spectral engineering" has been proposed using, e.g., a wavelength and bandwidth tuning mechanism to produce an apparent spectrum over a series of pulses in a burst of pulses output by the laser system that effectively contains a plurality of discrete spectra. The '294 patent and '925 application suggest that:

A fast responding tuning mechanism is then used to adjust center wavelength of laser pulses in a burst of pulses to achieve an integrated spectrum for the burst of pulses approximating the desired laser spectrum. The laser beam bandwidth is controlled to produce an effective beam spectrum having at least two spectral peaks in order to produce improved pattern resolution in photo resist film. . . . In a preferred embodiment, a wavelength tuning mirror is dithered at dither rates of more than 500 dithers per second in phase with the repetition rate of the laser. . . . In another embodiment, the maximum displacement was matched on a one-to-one basis with the laser pulses in order to produce a desired average spectrum with two peaks for a series of laser pulses. Other preferred embodiments utilize three separate wavelength tuning positions producing a spectrum with three separate peaks. (Abstract)

The Specifications of the '294 patent and/or the '925 Published Application referenced above also describe FIGS. 2A, 2B, 2C1–C3, 2D1–D3, 2E, 2F, 2G1–G3, 2H1–H3, 10A, 10B, 10C, 10D, 10E, 10F, 10G, 10H and 10I the descriptions of which are hereby incorporated by reference. The Specification also specifically notes, referring to the paragraphs in the '925 application as published:

A lithography technique, called FLEX (short for, "focus latitude enhancement exposure") has been shown (through simulation and experiment) to improve the depth of focus by utilizing multiple exposure passes of the same field with different focus settings. This technique is also commonly referred to as focus drilling, since the physical thickness of the photoresist film is exposed in multiple passes at incremental focus settings. The image in photoresist is formed by the composite of the multiple exposure passes.

Several difficulties result from this FLEX process with both step and scan as well as step and repeat exposure implementations. Multiple pass exposure results in additional overlay (image placement) errors and image blurring. This has further implications on process latitude, focus repeatability as well as wafer throughput since multiple exposures require multiple imaging passes.

A broad laser spectrum can offer some DOF improvement at the expense of contrast. FLEX, using the Z-axis focus control of the scanner stage, and the embodiments proposed by Fukuda II and Yan, using separate sources of laser output light at different center wavelengths which are thereafter optically combined, can produce two images focused in separate image planes, separated temporally or not. Using light arriving at the same time at the wafer through the scanner optics can, e.g., re-create the original double focal plane concept of FLEX by taking advantage of the longitudinal chromatic aberration of the PO lens (250–450 nm/pm)

The magnitude of the bandwidth effect will depend on many factors, such as, lens NA, lens chromatic aberration, feature size and type.

The effects of bandwidth may be similar to other causes of variation such as defocus, lens aberrations; partial coherence. The shorter the wavelength the more severe the consequences, e.g., 193 nm lenses have generally higher chromatic aberration than 248 nm lenses and a higher sensitivity of other aberrations to wavelength. It has also been determined that isolated and dense lines are affected in different ways, with some benefit for isolated lines but little improvement for dense lines. The benefits of the improved DOF appear to be optimum for certain types of imaging, e.g., contact hole imaging.

Certain other lithography parameters may also be affected, e.g., dose may have to be slightly higher for this RELAX technique. Optical proximity effects, linearity and mask error factor, line end shortening and perhaps other parameters will likely be affected. Effects on lens performance, e.g., distortion/displacements and aberrations may need to be determined.

U.S. Pat. No. 5,835,512, issued to Wada et al. on Nov. 10, 1998, entitled WAVELENGTH SELECTING METHOD IN WAVELENGTH TUNABLE LASER AND WAVELENGTH SELECTABLE LASER OSCILLATOR IN WAVELENGTH TUNABLE LASER, discloses an acousto-optical wavelength selection apparatus for selecting the wavelength at which a laser oscillator resonates, the disclosure of which is hereby incorporated by reference. U.S. Pat. No. 6,016,216, issued to Chang on Jan. 18, 2000, entitled POLARIZATION-INDEPENDENT ACOUSTO-OPTIC TUNABLE FILTER, discloses an acousto-optical filter utilized for wavelength division multiplexing, the disclosure of which is hereby incorporated by reference. U.S. Pat. No. 6,404,536, issued to Lean et al. on Jun. 11, 2002, entitled POLARIZATION INDEPENDENT TUNABLE ACOUSTO-OPTICAL FILTER AND THE METHOD OF THE SAME discloses an acousto-optical filter utilized to pass one beam without impact from the filter and another that is tuned by the filter.

It is well known that there is an interaction of light in certain materials that is a function of some external stimulation on the material, e.g., a acoustic stimulation (acousto-optic), an electrical stimulation (electro-optic) or even magnetic (magneto-optic). For example in an acousto-optic device, e.g., a non-linear crystal there occurs an effect associated with the interaction of light with sound, e.g., in the change of the diffraction of light by the acoustically perturbed medium, as is discussed in, e.g., P. Kerkoc, et al, "Molecular crystals for applications in acousto-optics" Phys. A: Math. Gen. 32 No 20 (21 May 1999), the disclosure of which is hereby incorporated by reference. As noted in Keroc when an acoustic wave propagates in a medium, there is an associated strain field. The change in the index of refraction that results from the strain is known as the photo-elastic effect. Since the strain field induced by the acoustic wave is a periodic function of position, the perturbation of the index of refraction of the medium is also periodic, leading to coupling between the modulating strain field and the optical wave. In this way, any transparent material can, e.g., be made to act as an optical phase grating. The photo-elastic effect, unlike the linear electro-optic effect, occurs in all states of matter and, in particular, in crystalline material belonging to all symmetry classes. Devices based on the acousto-optical effect operate at only a few volts as compared with the kilovolt or so required in an electro-optical modulator. However, the range of useful acousto-optical materials is limited, either because of their low figure of merit or as a consequence of the strong attenuation of ultrasound. At present there are, e.g., TeO2, $LiNbO_3$, GaAs, GaP and $PbMoO_4$ materials used as acousto-optical devices and some highly polar molecular crystals, e.g., 3-methyl-4-nitropyridine-1-oxide crystal (POM) used for acousto-optical properties. Other crystals may prove effective for applications according to aspects of the present invention, including, e.g., single crystals $MgF_2$, KDP, SiO2, PWO, CaMoO4, Ge, Si etc. Additionally, nonlinear optical organic crystals, e.g., 2-α-(methylbenzylamino)-5-nitropyridine (MBANP), which can show both strong electro-optic and piezo-electric responses may be useful for acousto-optical applications as suggested in the present application.

The effect can be utilized in a Raman-Nath cell or a Bragg cell.

The design and fabrication of bulk acousto-optic modulators (temporal modulation) and beam deflectors (spatial modulation) are described, along with, e.g., device parameters that can be obtained systematically for given specifications are discussed in E. Young et al., "Acousto-optics, deflectors, light modulation, modulators, bandwidth, design analysis, fabrication, impedance matching, light beams, wave interaction," IEEE, Proceedings, Vol. 69, January 1981, p. 54–64, the disclosure of which is hereby incorporated by reference. Young discusses modulation bandwidth, throughput efficiency and number of resolvable elements, and excitation of the devices, e.g., at up to a few hundred megahertz, and the effects. Young also discusses acoustic transducer response becoming sensitive to, e.g., intermediate metal layers between the piezoelectric transducer and the acousto-optic interaction medium. Also discussed therein are, e.g., criteria for material selection based on performance requirements and propagation loss. Practical considerations for the fabrication of high performance devices and specific device parameters are also discussed.

It is known in the art of high power gas discharge excimer (ArF or KrF) or molecular fluorine laser systems to select a center wavelength and narrow the bandwidth around the center wavelength by changing the angle of incidence of the inter-cavity light impinging on a grating line narrowing element. For Example as illustrated partly schematically in FIG. 5A, corresponding to FIG. 8 of U.S. Pat. No. 6,532,247, the disclosure of which is hereby incorporated by reference, and also corresponding generally to FIGS. 11A and 11B in U.S. Pat. No. 6,493,374, entitled SMART LASER WITH FAST DEFORMABLE GRATING, issued to Fomenkov, et al. on Dec. 10, 2992, the disclosure of which is also hereby incorporated by reference, a tuning mirror 14, comprising an essentially maximally reflecting mirror for a desired nominal center wavelength, e.g., around 192 for ArF excimer laser systems, may be mounted on a mirror mount 85 (14A in the '374 patent), as is further described in the '247 and '374 patent disclosures. It will be understood that the mirror 14 as shown in FIG. 5A is pivoted about a pivot axis (not shown) generally toward an opposite end of the longitudinal expanse of the mirror 14 from the end shown in FIG. 5A Applicants in the present application propose improved methods and apparatus for carrying out RELAX, which enable the enhancement of DOF on the one hand and also enable more agile response to needs for modification of wavelength, e.g., pulse to pulse in a gas discharge laser system of the type described above.

SUMMARY OF THE INVENTION

An apparatus and method for providing bandwidth control in a narrow band short pulse duration gas discharge laser output light pulse beam producing system, producing a beam comprising laser output light pulses at a selected pulse repetition rate, is disclosed which may comprise a dispersive bandwidth selection optic selecting at least one center wavelength for each pulse determined at least in part by the angle of incidence of the laser light pulse beam containing the respective pulse on the dispersive wavelength selection optic; a tuning mechanism operative to select at least one angle of incidence of the a laser light pulse beam containing the respective pulse upon the dispersive center wavelength selection optic; the tuning mechanism comprising a plurality of incidence angle selection elements each defining an angle of incidence for a different spatially separated but not temporally separated portion of the laser light pulse to return from the dispersive center wavelength selection optic a laser light pulse comprising a plurality of spatially separated but not temporally separated portions, each portion having one of at least two different selected center wavelengths. The tuning mechanism may comprise a temporal angle of incidence selection element defining an angle of incidence for different temporally separated portions of the pulse to return from the dispersive bandwidth selection optic a laser beam comprising a plurality of temporally separated portions of each pulse, each temporally separated portion of each pulse having one of at least two different selected center wavelengths. The tuning mechanism may comprise a plurality of spatial incidence angle selection elements each defining an angle of incidence for a spatially separated but not temporally separated portion of the laser light pulse, and a plurality of temporal angle of incidence selection elements each defining at least a first angle of incidence for at least a first temporally separated portion of each spatially separated but not temporally separated portion of the pulse and a second angle of incidence for a second temporally separated but not spatially separated portion of each spatially separated portion of the pulse.

BRIEF DESCRIPTION OF THE DRAWINGS

FIGS. 2C1–2C3 illustrates results of a simulation of a double-peak RELAX technique compared with similar simulations of a monochromatic beam and a conventional single peak spectrum with FWHM bandwidth of 0.45 pm and a 95% integral bandwidth of 1.86 pm, using, e.g., a FLEX illumination scheme;

FIGS. 2D1–2D3 illustrate another set of graphs made from the same data as was used for the FIG. 2C1–3 plots, useful in illustrating aspects of embodiments of the present invention, wherein exposure latitude (i.e., the percent by which the dose can be varied without causing the critical dimension to vary more than 10% from a target value is a function of the depth of a hole, e.g., having a target width of 200 nm;

FIGS. 2G1–2G3 illustrate simulations useful in understanding aspects of embodiments of the present invention, showing, e.g., basic concepts behind spectral engineering through determining using lithography simulation an optimal spectral shape, which will provide the maximum improvement of a given parameter;

FIGS. 2H1–2H3, illustrate simulations useful in illustrating aspects of embodiments of the present invention in which, e.g., a two dual-peak spectra (3 pm and 4 pm separation) is shown;

FIG. 3 is a schematic illustration of the operation of, e.g., a Bragg cell as a beam deflector, e.g., from one pulse to the next according to aspects of an embodiment of the present invention;

DETAILED DESCRIPTION OF PREFERRED EMBODIMENTS

Figure 1:
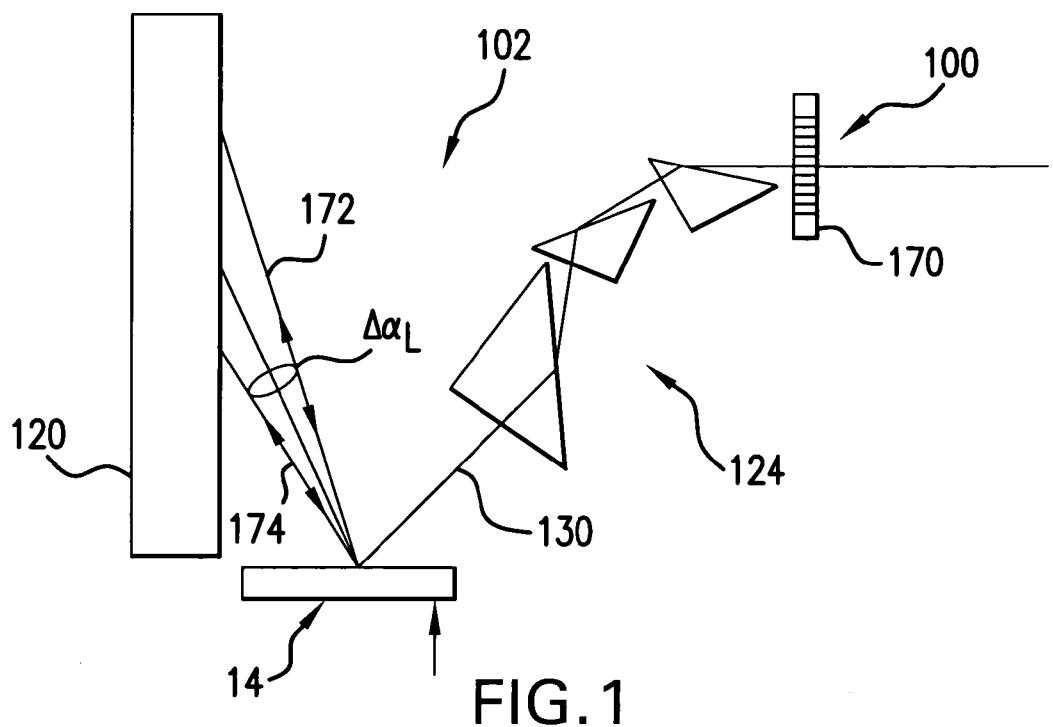
FIG. 1 shows schematically a beam deflecting system for shifting center wavelength according to aspects of an embodiment of the present invention.
Figure 2A:
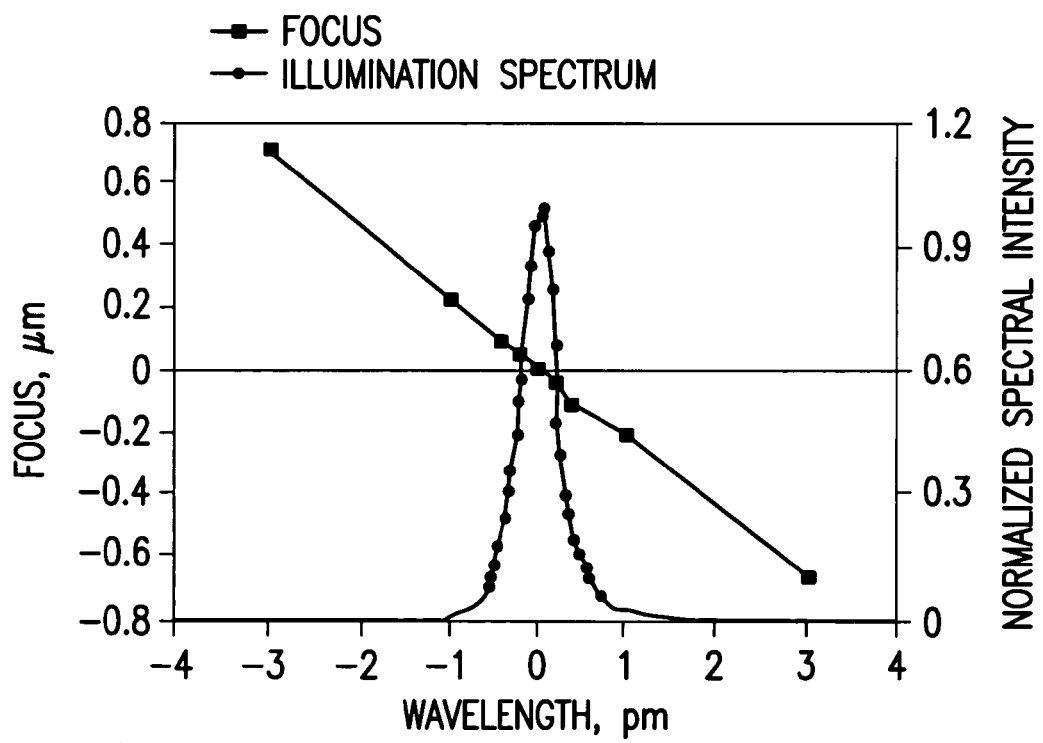
FIG. 2A shows the variation of focus with centerline wavelength for a modern 0.6 NA stepper type lithography using a line narrowed KrF light source having a FWHM bandwidth of about 0.35 pm, which is useful in understanding aspects of embodiments of the present invention, and also includes a plot of the laser spectrum plotted as normalized intensity versus deviation from the centerline wavelength, also useful in understanding aspects of embodiments of the present invention.
Figure 2B:
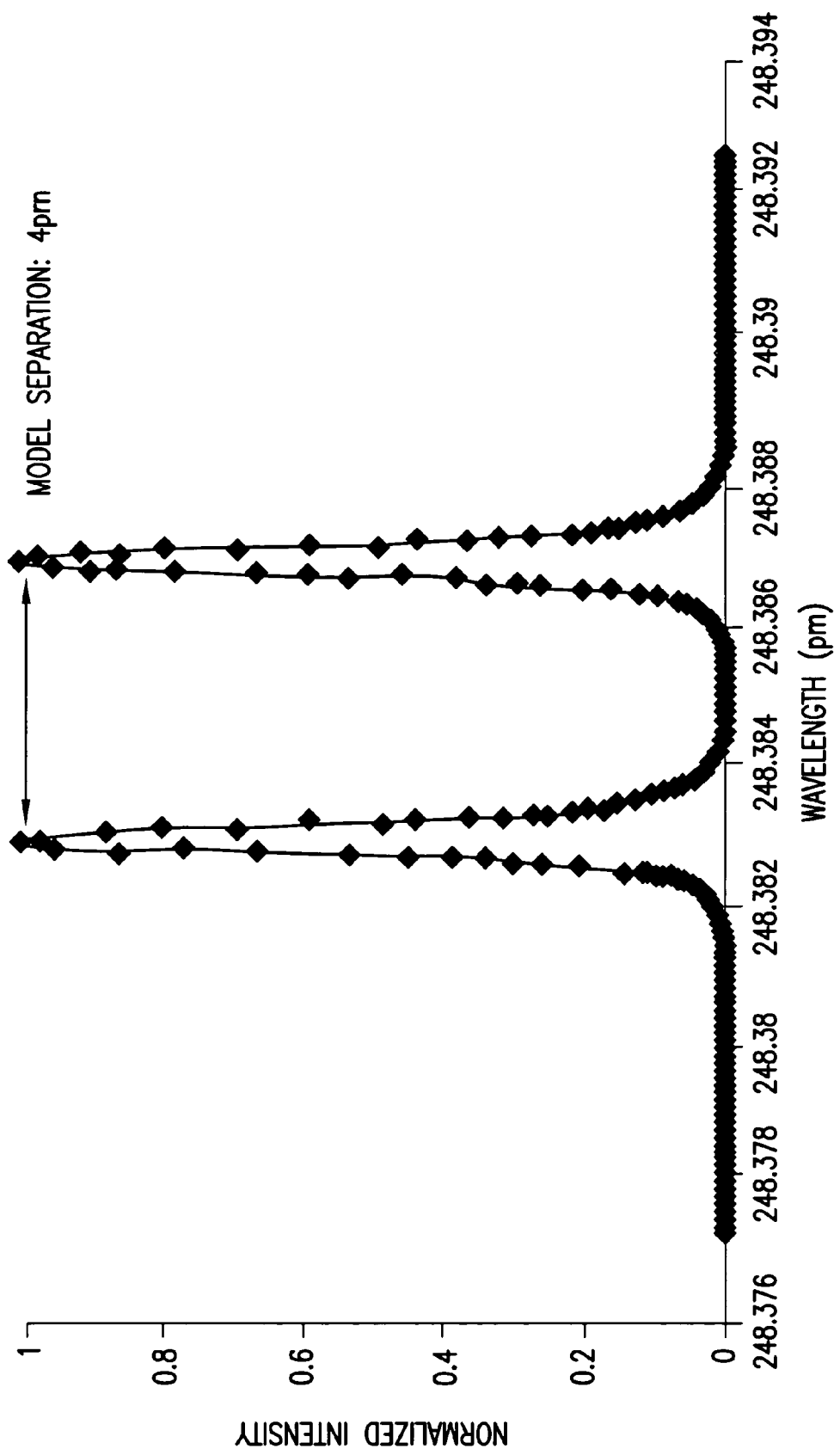
FIG. 2B illustrates a double-mode spectrum used as the simulation input wherein, e.g., the spectrum is generated by summation of a single mode (nominal) spectrum (bandwidth: FWHM=0.45 pm, E95%=1.86 pm) and its copy with, e.g., a 4 pm wavelength offset which is useful in understanding aspects of embodiments of the present invention, wherein SRELAX(λ) can be expressed as SRELAX(λ)=S (λ)+S(λ−2 pm)
Figure 2E:
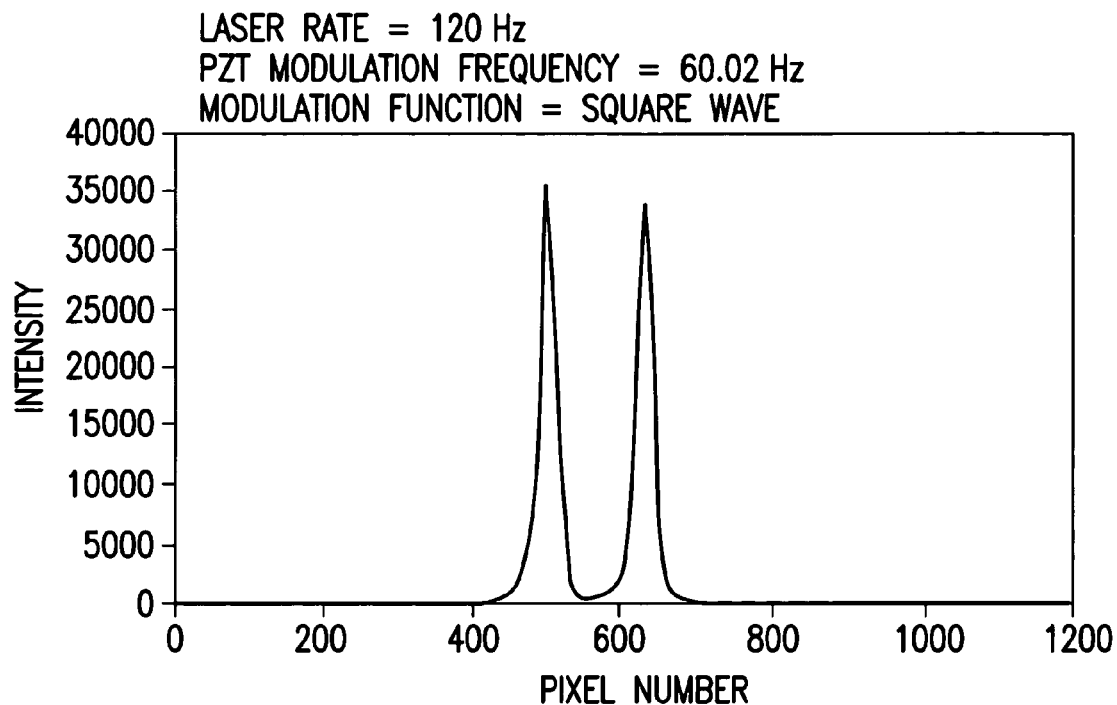
FIGS. 2E and 2F illustrate simulated performance of RELAX, e.g., on the basis of pulse-to-pulse changes to the center wavelength using in part a piezoelectric driver to control the wavelength to adjust each pulse on a pulse-by-pulse basis, e.g., plus or minus steps of 4.0 pm from the prior position, i.e., ±2 pm about a central wavelength.
Figure 2F:
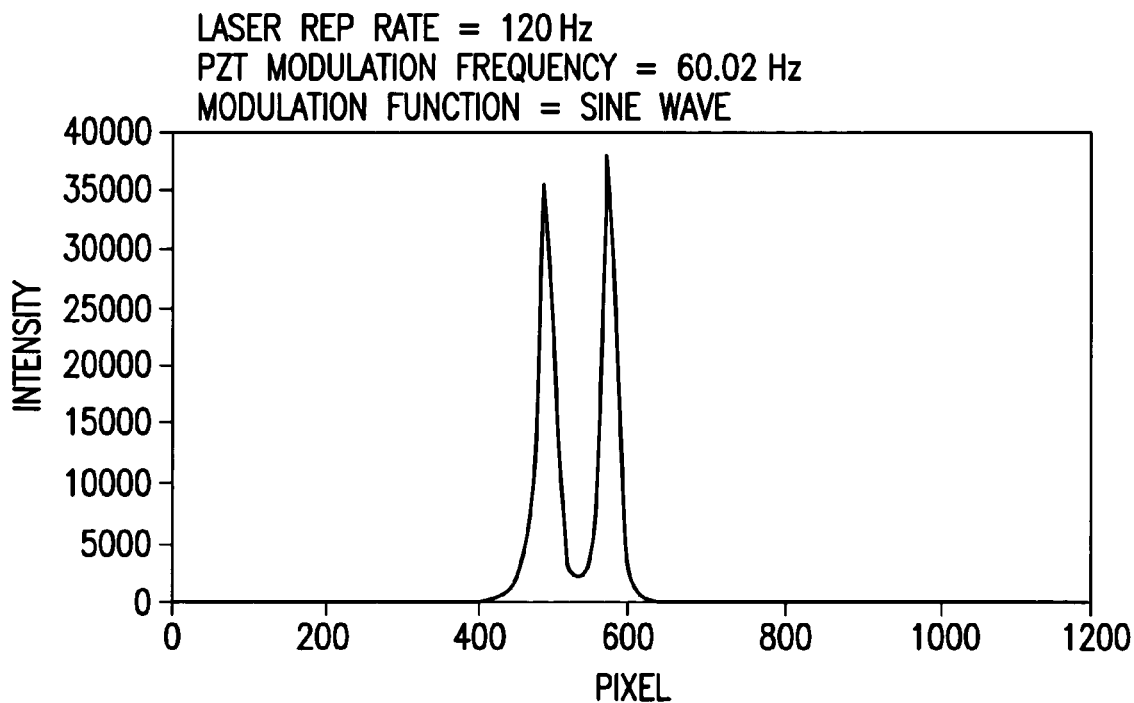

Applicants propose according to aspects of embodiments of the present invention several alternative improvements to providing a laser light source output that is an improvement to previously proposed ways of providing multiple peaked spectra, e.g., for enhancing DOF. According to aspects of an embodiment of the present invention a dithered center wavelength may be provided in which a conventional single-peak spectrum having a center wavelength has its center wavelength changed quickly, e.g., in an alternating pattern within a single scan window, i.e., from pulse to pulse to first have at least one center wavelength and then at least one other. This may be done in one aspect of an embodiment of the present invention, utilizing very agile wavelength control. Alternatively there can be provided in the same laser output lithography light source beam a plurality of pulses, each with a multiple-peaked spectrum produced in every pulse, or substantially every pulse, such that over, e.g., a series of pulses, which may be in a burst or continuously generated, an integrated spectrum of multiple peaks can be generated,. This may be done using advanced wavefront engineering in the line-narrowing optics of a laser lithography light source system. A multiple spectrum can be provided according to aspects of embodiments of the present invention with a minimum interaction with the lithography scanning process, no interaction with the normal laser output light wavelength tuning process, minimal effect on laser efficiency, a continuously variable peak separation, if desired, the accommodation of variable lens forms and illumination methods, and the ability to provide feedback controlled separation between separate pulses. The ability may be provided to balance energy in each peak. Also according to aspects of an embodiment of the present invention there may be provided the ability to easily turn the system off, e.g., going to zero peak separation, and thereafter for some period of time to run as a normal single-peak spectrum. Also there may be an ability to use the system according to aspects of embodiments of the present invention for bandwidth stabilization in addition to utilization for DOF reasons, e.g. by dithering the spectra in different pulses to create two spectra centered about center wavelengths with a desired center wavelength intermediate the two peaks, such that integrated over the duration of a number of pulses the bandwidth is a slightly broader bandwidth centered at the desired center wavelength, and, as time passes and the bandwidth attainable for each of the separate spectra increases, decreasing the separation of the two different center wavelengths so that the integrated spectra remains the same over time.

According to aspects of an embodiment of the present invention the multiple spectra peaks may be provided in spatially but not temporally separated portions of the beam, i.e., in each pulse, e.g., by reflecting different spatially but not temporally separated portions of the beam onto a wavelength selection optic, e.g., a standard eschelle grating well known in the art as such a wavelength selection optic. By doing so at different incidence angles for different spatially separate portions of the single beam, there can be returned from the grating different spatially separated portions of the single beam of laser output light pulses having different center wavelength peaks, within the same pulse. So far as the integrated circuit lithography tool is concerned, however, the DOF effect will be essentially the same as if the entire beam pulse uniformly contained a plurality of spectral peaks uniformly distributed spatially throughout all of the pulse, even though this is physically not the case.

Agile tilt control can changes the center wavelength on a pulse to pulse basis, e.g., every 250 μs, with certain advantages to doing so, including, e.g., the spectral peaks can be naturally balanced in shape and energy content, the use of fast energy control to unbalance energy, if desired, the requirement of very few metrology changes, and the possibility for use also for bandwidth control and RELAX, and the ease of turning it off completely. Resonance effects may increase the difficulty and complexity of doing this at high repetition rated, e.g., every 250 μs at 4000 Hz. One mechanism for agile tilt control, according to aspects of embodiments of the present invention can be the use of stimulated optical elements, e.g., acousto-optical elements or other stimulated optical elements such as electro-optical elements or magneto-optical elements that, e.g., change refractive index under the stimulation of sound waves, electrical fields or magnetic fields, or separately bending or torquing optical elements that are wholly separated or slotted or slit for independent movement, with, e.g., mechanical, electromechanical or piezoelectrical-mechanical force application or combinations thereof, or combinations thereof and also stimulated optics.

According to aspects of an embodiment of the present invention applicants propose to produce a split angular spectrum, e.g., within the laser resonator cavity, which when reflected, e.g., in Littrow configuration off of a dispersive wavelength selection optic, e.g., a grating, translates into a split spectrum with each of a plurality of spectra centered about a selected center wavelength occupying a spatial distribution but not temporally separated portion of the pulse. This may be, e.g., a split angular spectrum side-to-side or top-to-bottom or both within the beam in each pulse. This may be produced by a split wavefront produced, e.g., by slicing and bending a tuning mirror, e.g., an Rmax mirror. According to aspects of embodiments of the present invention relative tilt may therefore be separately adjustable and may be driven convex or concave, and may also, e.g., leave unaffected, a normal Rmax positioning for central wavelength tuning, e.g., for selecting the center between two center wavelength peaks, or a single center wavelength, e.g., when RELAX is not on.

According to aspects of embodiments of the present invention one may need, e.g., for a wavemeter able to interpret a multiple peak spectra, without becoming confused, wherein, the fringe pattern analysis will need to extract, e.g., absolute wavelength along with peak separation and relative energy. This may be done, e.g., with wavemeters of the type presently being sold on applicants' assignee's laser system products, e.g., 7000 series and XLA series products, which may be modified to only lock onto a specific one of the peaks, and identifying which one it is.

Figure 5:
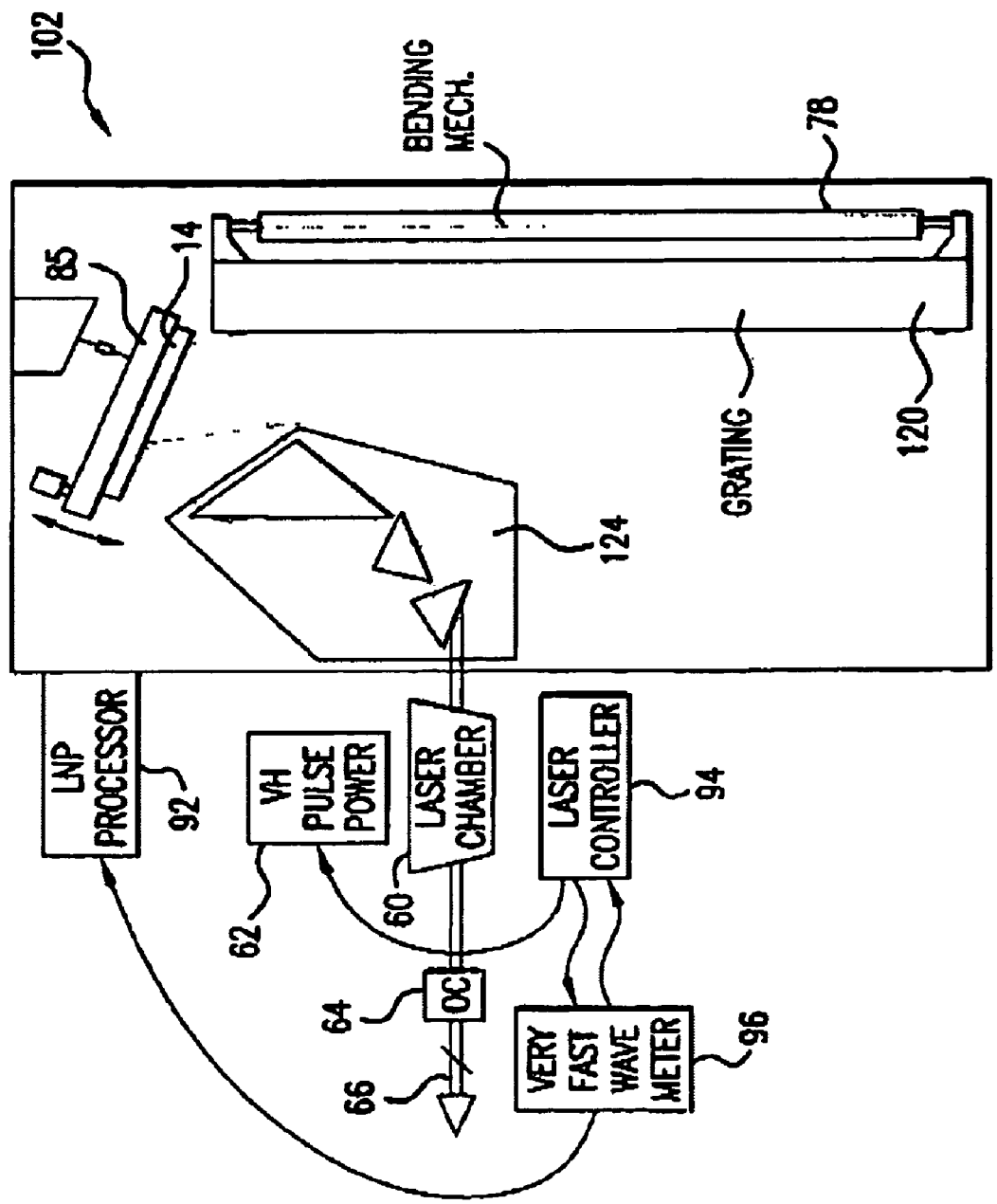
FIGS. 5 and 5A show a prior art tuning mirror and its mount useful carrying out aspects of an embodiment of the present invention, e.g., for tuning pulse-to-pulse or within a single pulse.

Overall, a system according to aspects of embodiments of the present invention may be included, e.g., within a known line narrowing module ("LNM") 102, e.g., as shown illustratively and partially schematically in FIG. 5. Turning to FIG. 5 there is also shown a laser system including the LNM 102, which may comprise, e.g. a laser chamber 60, defining a lasing resonator cavity comprising, e.g., the laser chamber 60, the LNM 102 and an output coupler 64 as is well known and understood in the art. The system may also comprise a laser controller 94, which, among other things may receive input from among other places a wavemeter 96 and provide, among other things, voltage control to a high voltage pulse power system 62 to maintain, among other things laser output light pulse energy, e.g., for proper dose control at the machine (not shown) receiving the laser output light pulses in an output laser light beam 66, e.g., a semiconductor integrated circuit lithography tool.

The LNM 102 may include, e.g., a grating center wavelength selection optic 120 and, e.g., a mechanism for tilting a laser pulse beam onto the grating 120, e.g., a tuning mirror 14 as described in the above referenced patents in regard to FIG. 5.

According to aspects of embodiments of the present invention the LNM 102, otherwise known as a line narrowing package ("LNP") may, e.g., be much as just described and as will be further described below, along with certain RELAX modifications, which may include one or more RELAX grating angle of incidence selection elements, e.g., non-stimulated optical elements, stimulated optical elements, additional actuators, e.g., for adjusting energy balance, and actuator drivers.

Figure 7D:
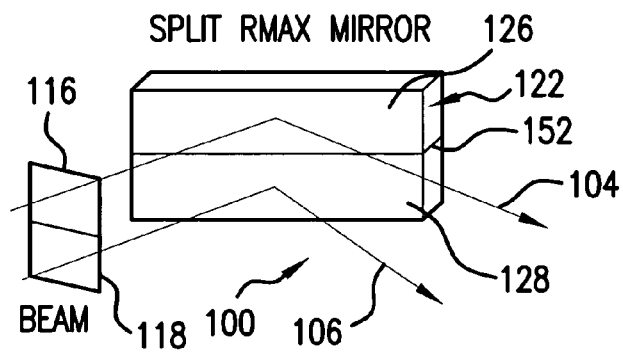
Figure 8A:
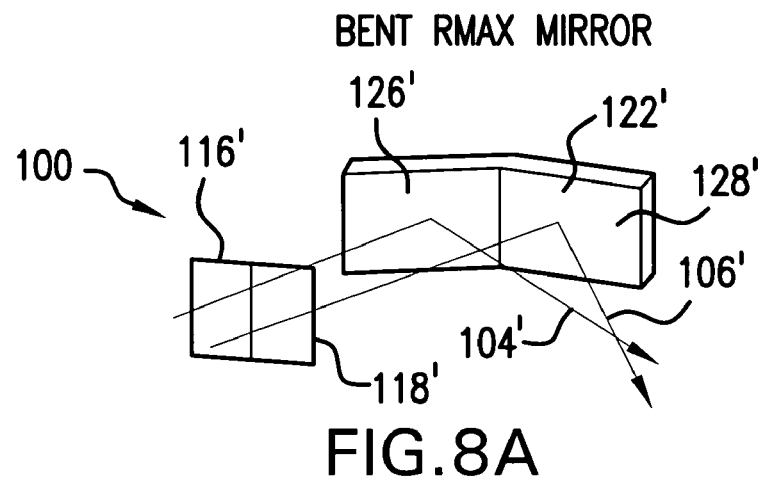
FIGS. 8a–8c show schematically aspects of an embodiment of the present invention in which separate horizontal portions of the beam (right and left) create separate center wavelengths.

It will be understood that according to aspects of embodiments of the present invention, e.g., for a split Rmax, the Rmax tuning mirror 14, as illustrated in FIG. 5 may be split lengthwise along, e.g., its centerline in the longitudinal axis (in the plane of the paper as illustrated in FIG. 5) and the driving mechanisms duplicated for each half, e.g., two stepper motors as described the above referenced applications and patents. Each half of the split Rmax 126,128, as illustrated in FIG. 7d could be mounted on its own mounting and separately angled to direct onto the grating 120 spatially separate portions of the pulse beam at different incidence angles on the grating 120. Similarly a bent Rmax 14 as illustrated in FIG. 8a could have a grove on its rear surface along the longitudinal centerline (normal to the plane of the paper as illustrated in FIG. 5) and similarly be provided with separate tilting mechanisms as described above oriented to pivot each half about the groove as a pivot point to thereby direct onto the grating 120 spatially separate portions of the beam at different incident angles and receive back from the grating two selected center wavelengths.

According to aspects of embodiments of the present invention, e.g., fast dithering techniques without split optics may also be employed or employed in combination with split optics, e.g., as an alternate approach. Aspects of embodiments of the present invention lend themselves very well to such applications as for very agile bandwidth stabilization control, even with single bandwidth peak spectra in a given pulse, as noted above, or when maintaining a selected bandwidth during, e.g., a burst, within some selected range of bandwidths, along with center wavelength.

According to an aspect of an embodiment of the present invention, for a grating that has a Littrow angle of 78.9°, the angular change to produce, e.g., a split spectrum of e.g., ±0.5 pm on either side of a center wavelength for the beam, i.e., a 1 pm peak to peak separation, the needed wavefront tilts at various points in the optical path of LNPs of the type sold in applicants' assignee's above mentioned products, e.g., with 30× beam expanders, would amount to about 25 μR after the beam expander and 0.77 mR before the beam expander.

According to an aspect of an embodiment of the present invention applicants propose to utilize alternative full beam methods and apparatus, e.g., to produce two peaks in the whole beam, in each pulse of the whole beam, which may be done, e.g., with a far field system, e.g., utilizing a phase plate (diffractive optical element "DOE") that gives the effect in the far field of a split wave front. Alternatively using two LNMs, e.g., orthogonal to each other, could be a way to produce two center wavelength spectra, of course, at the added cost of two LNMs. An alternative near field approach could use, e.g., a double output coupler, i.e., double resonator system.

Alternatively, partial beam methods may be employed according to aspects of an embodiment of the present invention to produce, e.g., a spatially distributed dual spectrum, i.e., one spectrum around a first center wavelength in one spatial part of the beam, and another spectrum about another center wavelength in a second spatially separate part of the beam. This may, however, result in differing tilts, which may be accommodated by alternately flipping the image with a vertically split Rmax, or a vertically split prism. There may also be a need to use matched wavefront prisms, e.g. by sawing one in half as opposed to fabricating two separately, unless there is available a beam control device ("BCD") that can, e.g., be optimized to the same function delta wavefront within some threshold. It is also possible, according to an aspect of an embodiment of the present invention to use two wedges that have no magnification, or single optic that is split by a groove or slot, but not into two separate pieces, e.g., using ultrasonic machining, and which may, e.g., be operated at Brewster's angle so that it need not be coated and which also avoids impacts of the coating on the separation of the peaks. A split prism may have to be coated up to the edge of the optic, which may, e.g., be done at the interface between the aperture and third prism (first prism from the chamber to the grating).

Another alternative according to an aspect of an embodiment of the present invention may be, e.g., a horizontally split Rmax. A phase plate, i.e., top versus bottom prismatic angular shift may also be used.

Another alternative approach may be, e.g., to provide for a time dependent differing bandwidth within a laser beam that is a plurality of pulses, i.e., on a pulse-to-pulse or substantially pulse-to-pulse basis, within, e.g., a series of pulses, which may be a burst of pulses or continuous pulses. This may be accomplished, e.g., by intermittently injecting a wavefront change, every other pulse by dithering by dithering the Rmax. It may also be accomplished by using a stimulated optical element that is differentially stimulated from pulse to pulse. This approach can be very close in effect seen at the lithography tool to intra-pulse solutions temporally but not spatially separated or spatially separated.

Requirements according to aspects of an embodiment of the present invention include, e.g., up to at least 2 pm of adjustable separation, utilizing the full beam, with an independence from BW control, the ability for peak balancing and preferably within a single pulse. Single-pulse gives the least possibility of there being an interaction with the scanning process. In order to get the BW in each peak with mechanical dithering of non-stimulated optical elements will likely require, e.g., an almost purely rectangular drive to the dithering mechanism, or else the DOF advantages may be diminished due to loss of contrast in each spectrum at the wafer.

According to aspects of embodiments of the present invention, e.g., an acousto-optical plate or other stimulated optical element may be a preferred approach. This could be, e.g., frequency and/or amplitude modulated and provide excellent multiple peaks with central wavelength control, e.g., on a pulse-to-pulse basis. In addition, techniques are available to steer the acoustic shear wave through the material, an acousto-optical crystal, made from fused silica or quartz, or the other materials mentioned above. This steering may be done using a phased array of ultrasonic transducers. In this manner, e.g., the need to move the acousto optic crystal for each separate center wavelength, in order to obey Bragg's law, in a Bragg cell, i.e., $n\lambda=2d$ sine $\theta_i$, where $\theta_i$ is the angle if incidence on the acousto-optical device, and d is the vertical separation between layers of atoms from which Bragg scattering is occurring, and n is an even integer. This can enable maintaining the energy intensity in the geometrically selected order of the output of the Bragg cell optic. That is to say, the wavefront splitting accomplished by a Bragg cell provides a first angle of incidence on the grating in response to a first frequency of acoustic excitation $\omega_1$ and a second grating angle of incidence according to a second excitation/stimulation frequency $\omega_2$. However, changing the frequency from $\omega_1$ to $\omega_2$ changes the ability to meet the Bragg's law matching conditions, which, without some movement of the acousto-optical device itself, will cause some deviations, e.g., resulting in a much smaller achievable angle of separation of the outputs from $\omega_1$ to $\omega_2$, and perhaps also in the energy distribution in the interference pattern set up by the effects of the acousto-optical device. Therefore, the selected order tuned geometrically to have the maximum amount of transmitted energy (for efficiency purposes) may slightly vary giving center wavelength peaks of slightly different amplitude. This can be accommodated, however, by providing the stimulation to the stimulated optic, e.g., the Bragg cell acousto-optical device, through the use of a phased array of transducers. The phased array may be used to steer the stimulating wave in the acousto-optical crystal, as is known in the art of acousto-optical devices, to counteract the failure to move the Bragg cell itself from $\omega_1$ to $\omega_2$. Further wavefront engineering of the output of the stimulated optic, e.g., the Bragg cell acousto optical device, may also be accomplished by frequency slipping the phased array as is known in the art of acousto-optics.

Figure 7A:
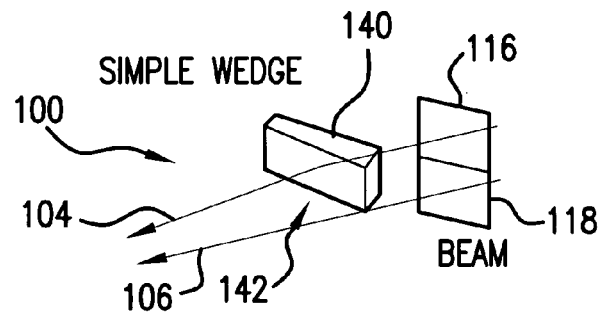
FIGS. 7a–7d show schematically aspects of an embodiments of the present invention in which separate vertical portions of the beam (top and bottom) create separate center wavelengths.

According to an aspect of an embodiment of the present invention one approach to providing, e.g., a wavefront splitter 100, e.g., in an LNM 102 as illustrated in FIG. 7a, could employ a single wedge 140 (non-stimulated optical element) upon which a first spatially defined portion 116 of the laser beam pulse is incident and refracted to form a first spatially defined portion 104 an output beam and an aperture 142 (absence of an optical element) through which a second spatially defined portion 118 of the beam passes, without refraction to form a second spatially defined portion 106 of an output beam 106. The different deflections of the beam portions 116, 119 through the non-stimulated optical wavefront splitter 100 comprising the wedge 140 and aperture 142, including the lack of deflection through the aperture 142, results in an output beam returning from the grating 120 to the beam expander 124, with the spatially defined portion 116 containing a first selected center wavelength and the spatially defined portion 118 containing a second selected center wavelength.

Figure 7B:
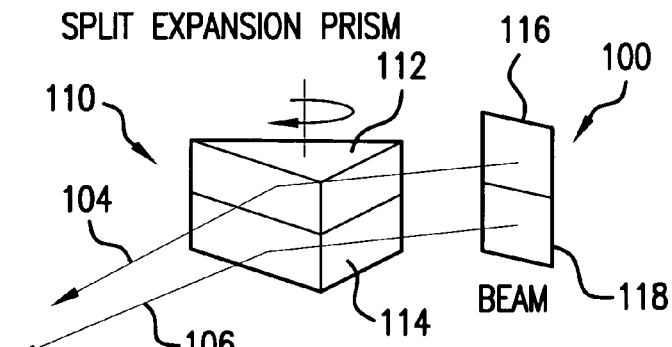

According to aspects of embodiments of the present invention another possibility could be to use, e.g., a split prism 110 as illustrated in FIG. 7b, as the wavefront splitter 100. The split prism 110 can be split into an upper half 112 and a separate lower half 114 (with upper and lower being understood to refer only to those orientations as illustrated in the figures herein and not to limit orientation in the actual implementations) so that each separated half 112, 114 could be pivoted or tilted slightly (i.e., rotated) relative to the other and/or such that only one can be rotated with respect to the other on a mounting (not shown) that itself can be rotated. The one prism 112 may be rotatable with respect to the mounting with the other prism 114 being fixed to the mounting (not shown). This difference leads to a change in angle towards and away from the grating 120 with respect to the relative angles of the two prism halves 112, 114, resulting in a difference in line-center in a first beam portion 116 with respect to a second beam portion 118. The resulting laser beam 130 has one line-center for the upper portion of the beam 116 and a different line-center for the lower portion of the beam 118.

It will be understood that as with all of the non-stimulated split separated or split grooved optical elements discussed herein, differential rotation or tilting of one portion of such a non-stimulated optical element with respect to the other will change potentially the two selected center wavelengths and thus the peak to peak separation, but also potentially the central wavelength positioned between the peaks (the same principal applies to three or more peaks). Since it may be desirable not to change the central wavelength, the control system for such non-stimulated optical elements may have to adjust the respective displacement of the several portions of the non-stimulated optical element and also, e.g., with a separate control of the deflection of each created spatially defined portion of the beam, e.g., off of an Rmax, maintain the desired central wavelength between or among the plurality of peaks.

Another possibility is for a split Rmax 122, e.g., a standard Rmax optic 14, e.g., as shown in FIG. 5, and discussed above. With this modification, the portion 126 of the mirror 122 could be differentially angled from the other portion 128 leading to two different line-centers for the top half 116 and the bottom half 118 of the beam, due to the differing reflections 104 and 106 incident on the grating 120 at different angles.

As tested by applicant the resulting spectrum in the beam, spatially (but not temporally) separated in halves 116, 118 of the beam 130, consists of two peaks of a bandwidth, e.g., as measured at FWHM, that is roughly equivalent to the original single peak due to the fact that each peak in beam portion 116 and beam portion 118 only used half of the full aperture of the grating 120. This tends to increase the bandwidths of each separate peak, and the offset effect of the fact that the divergence, or rainbow effect, is also reduced by half when only half of the mirror 14 (as split into split Rmax 122) is used. The two effects generally offset each other and the resulting spectrum consists of two peaks with similar spectral width as the original single peak without spatially splitting the beam. The distance between the spectral peaks at the first center wavelength in portion 116 and the second center wavelength in portion 118 is a function of the differing incidence angle on the grating 120 due to the differential positioning, e.g., of the portions 126 and 128 of the split Rmax 122.

Figure 7C:
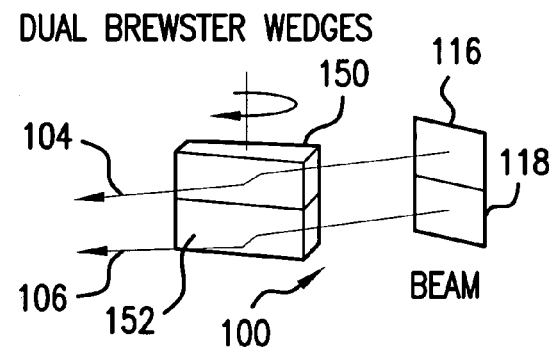

As illustrated schematically in FIG. 7c, another exemplary possibility is to utilize a pair of wedges, e.g., dual Brewster wedges 150 and 152, which again are relatively positionable with respect to each other about the rotational axis shown in FIG. 7c, and again can be so positioned by moving one while leaving the other stationary or moving both at the same time, as discussed above. This then has the effect of producing the two outputs 104 and 106 from beam portions 116 and 118, to produce in the beam portions 116 and 118 returning from the grating different spectral peaks centered at different center wavelengths.

Figure 9:
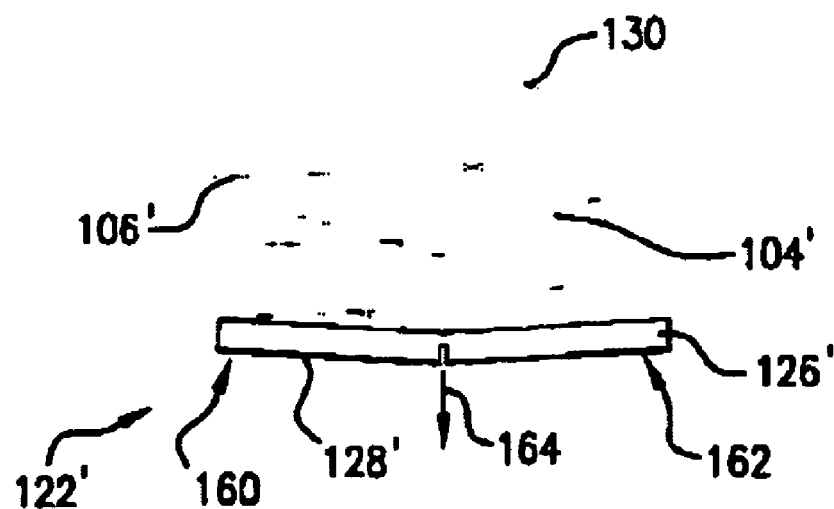
FIG. 9 shows schematically the splitting of a single wavefront, e.g., from a beam expander, incident on a split tuning mirror (Rmax) forming two separate wavefronts within the beam, spatially separated within the beam.
Figure 8B:
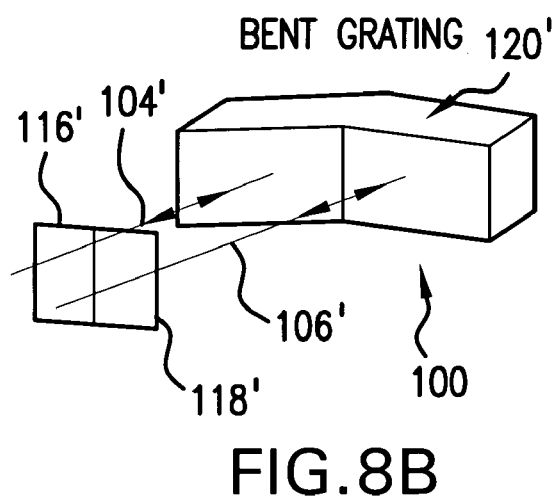
Figure 8C:
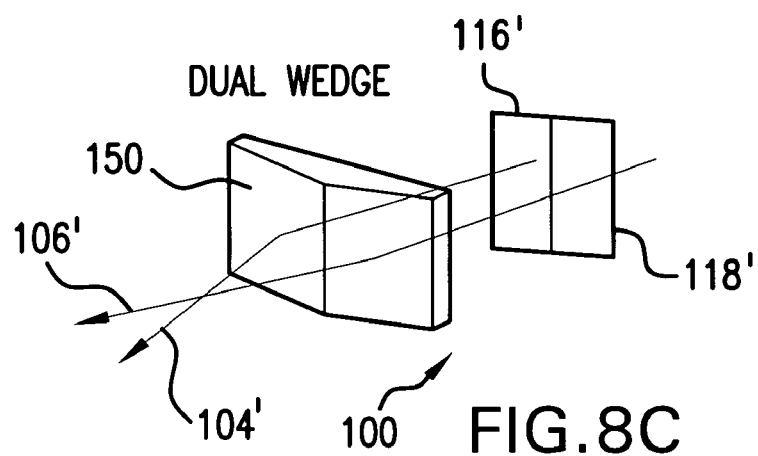
Figure 10A:
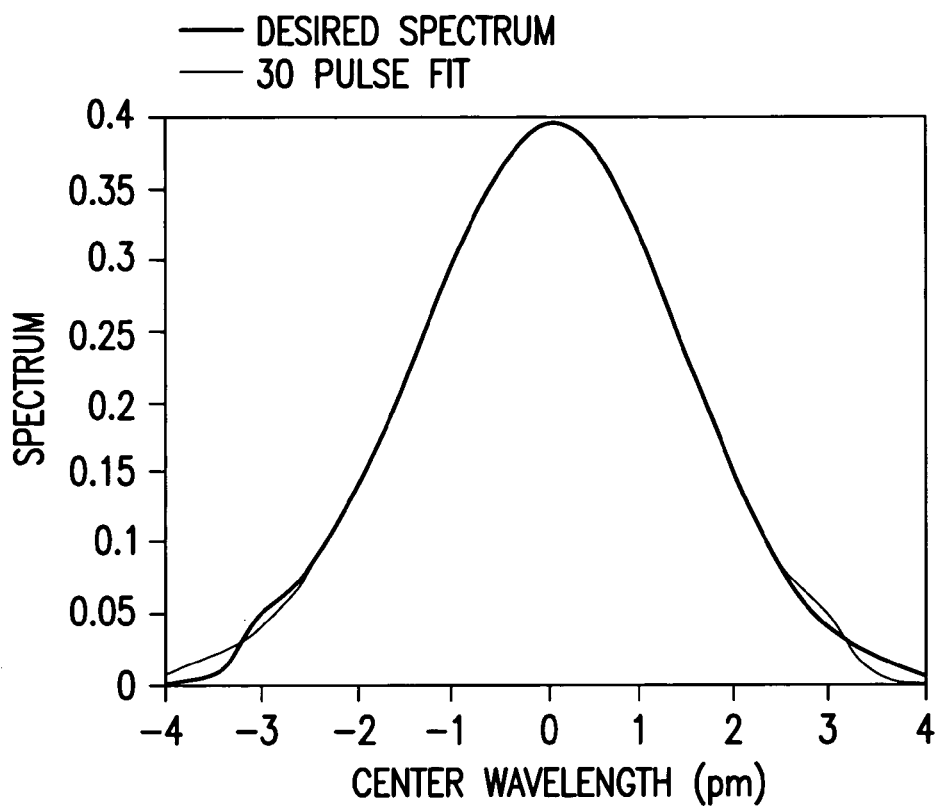
FIGS. 10A–10G show simulations illustrative of aspects of embodiments of the present invention of controlling, e., g., a tuning mirror pulse-to-pulse, that are illustrative of possible implementations of embodiments of the present invention, with FIG. 10A showing a desired Gaussian spectrum with FWHM of about 3.3 pm and a simulated fit for a 30-pulse window of pulses having a FW of 0.8 pm, FIG. 10B showing an illustrative proposed sequence of pulses in a window, FIG. 10C illustrating a simulated comparison of the frequency content of a smooth wavelength sequence such as in FIG. 10B with a random sequence, and FIGS. 10D and 10E, respectively illustrating a 133 Hz sine pattern and a 30-pulse window, and FIGS. 10F and 10G showing how to produce a flat-top spectrum.
Figure 10B:
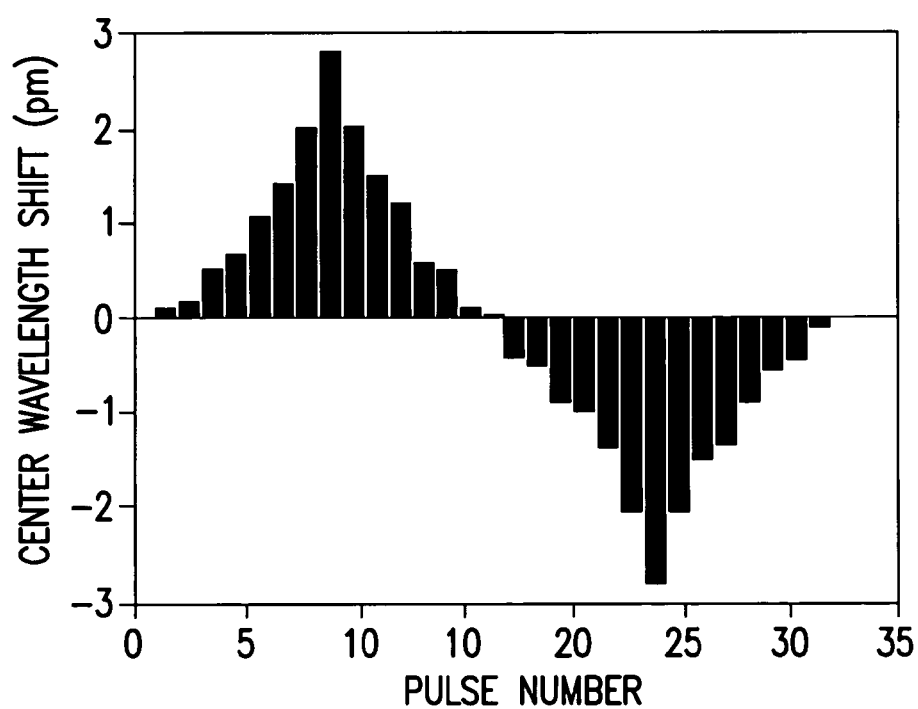
Figure 10C:
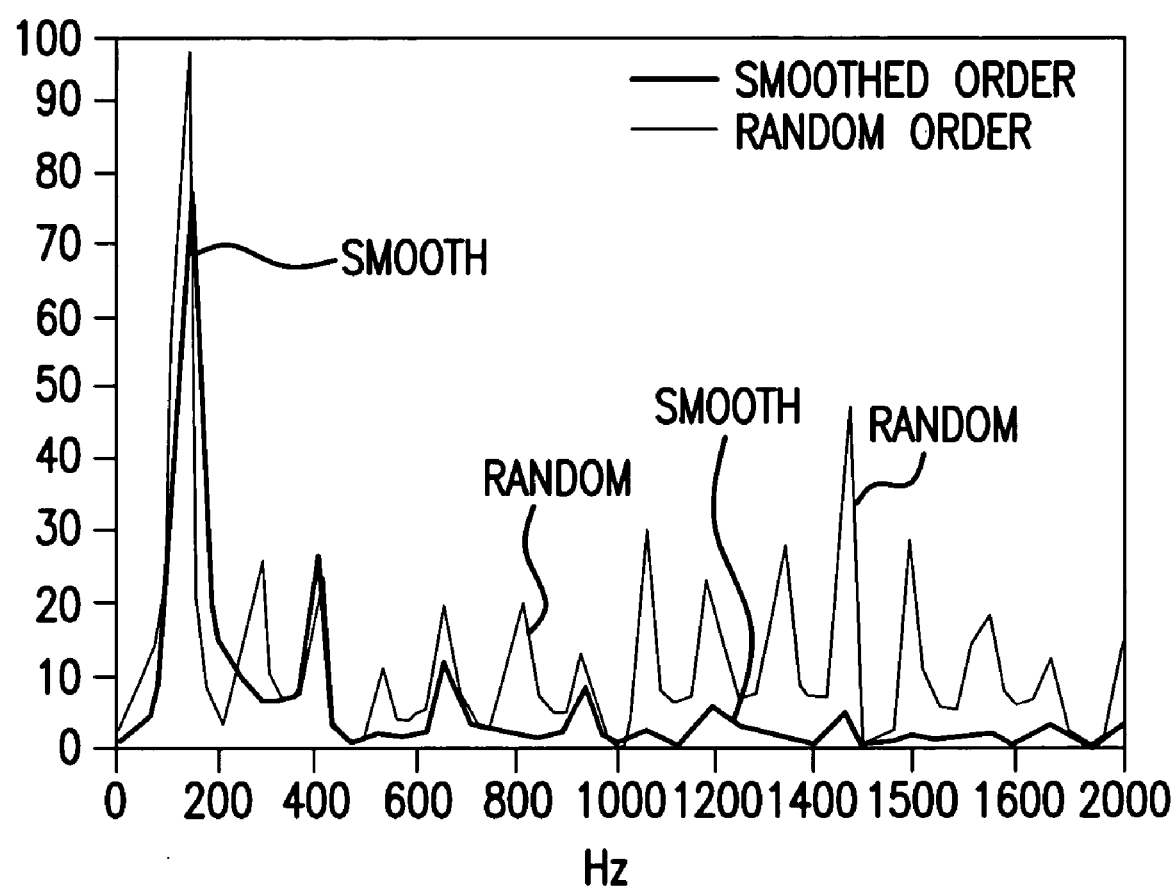
Figure 10D:
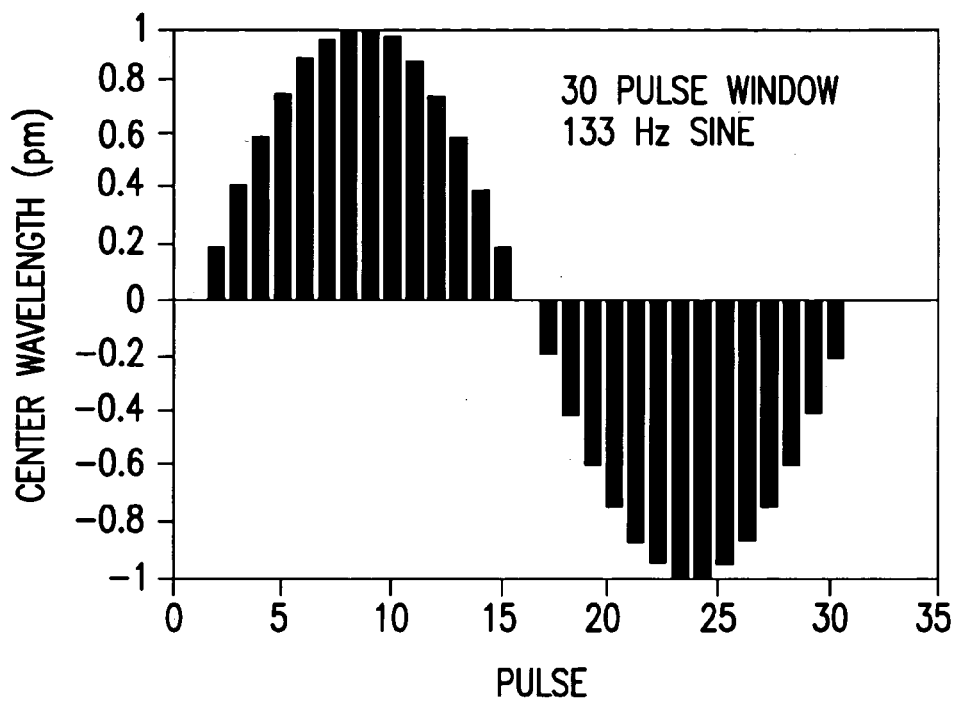
Figure 10E:
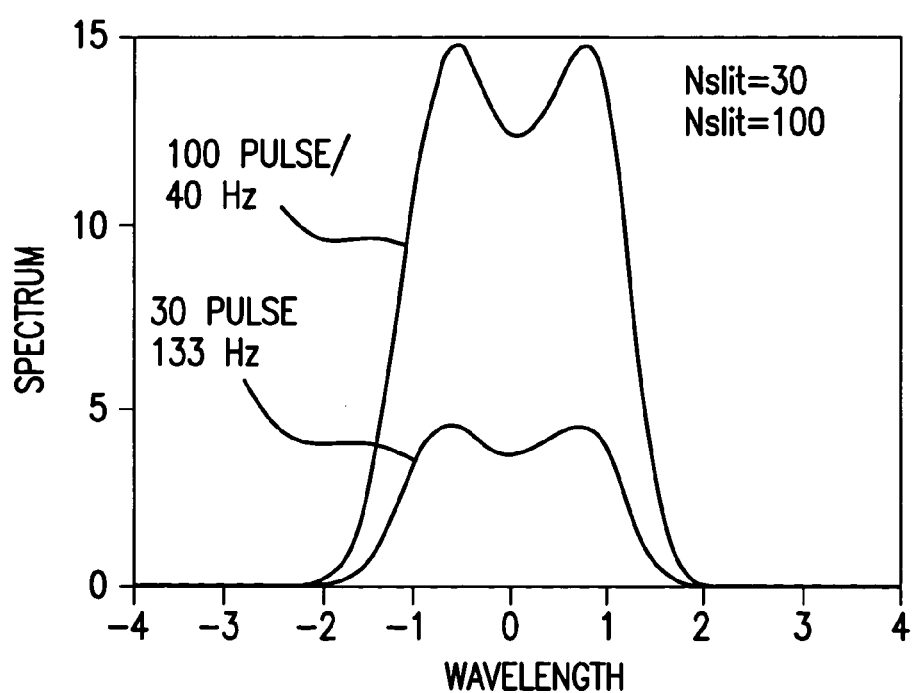
Figure 10F:
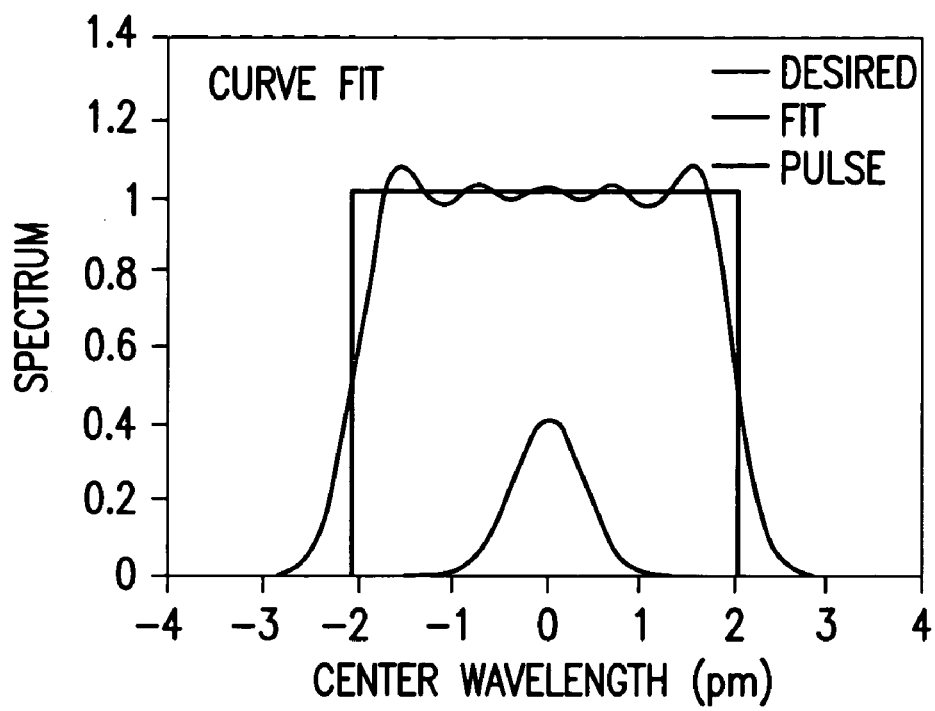
Figure 10G:
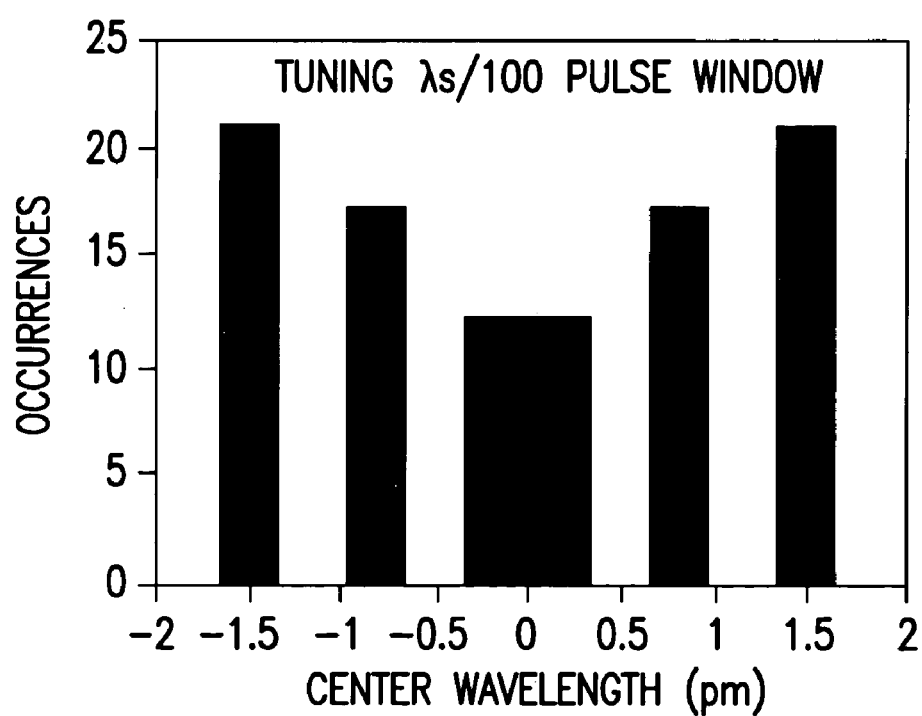
Figure 11:
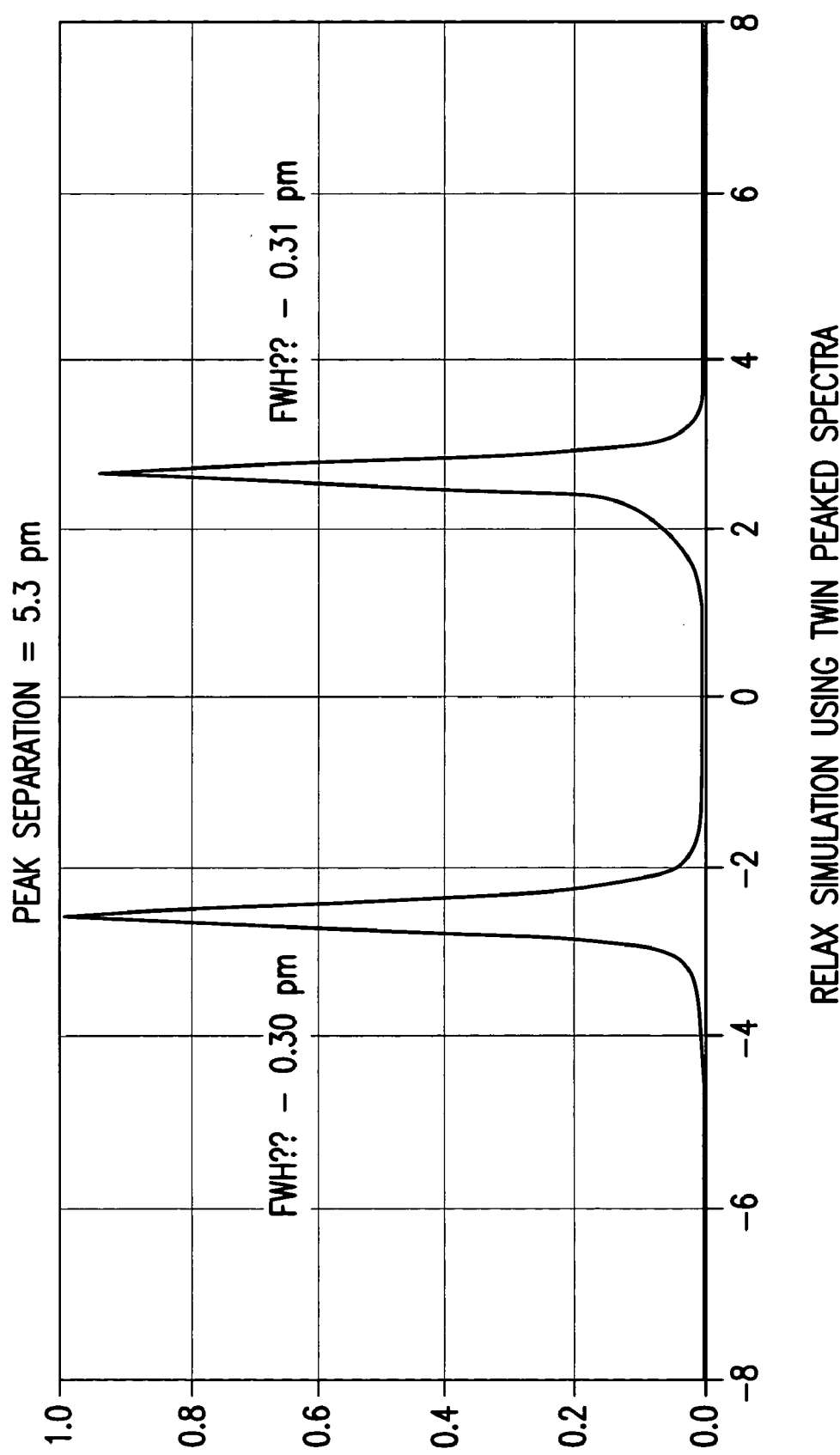
FIG. 11 shows an illustration of a simulated production of two peaks in a single beam, according to aspects of an embodiment of the present invention with, e.g., varying peak intensities.

Similarly in FIGS. 8a–c there are shown techniques for providing spatially separated portions of the beam, e.g., a first side portion 116' and a second side portion 118' whereby each side portion 116', 118' contains a separate spectrum centered on a separate center wavelength. For Example, in FIG. 8a there is illustrated schematically a bent or split Rmax 122' in which the halves may not be completely separated, but may have a groove or V slot formed in the non-reflecting side of the optic 122', as shown in somewhat more detail, but also schematically, in FIG. 9, e.g., by applying a force 164 to the optic 122' while holding the edges 160, 162 of the two portions 126', 128' in place. In this manner, the optic 122' may be differentially deflected or one side 126' deflected while the other 128' remains stationary, to thereby form a beam 130 having a right side 118' and a left side 116' (as right and left are illustrated in FIGS. 8a–c and not limiting of actual implementations). These form incident half beams 106', 104' on the grating. As is illustrated in FIG. 9, and as is essentially true of all of the above described non-stimulated optical element beam wavefront splitters, the beam 130 is incident on the optic, e.g., 122' with essentially a single wavefront and the spatially separated portions 116', 118' are differentially reflected/transmitted to form essentially two spatially separated wavefronts each incident on the grating with a different angle of incidence.

Similarly, a grating 120' may itself be split or slotted or grooved or otherwise bent or deformed as is known in the art, as discussed above with respect to the Rmax 122,' to return in a beam that would have had a single angle of incidence on the grating 120', where it not bent, two separate portions of the beam, 116', 118' on a first side and a second side of the beam 130, as the result of reflections 104', 106' from the different portions of the grating 120' with different spectra at different center wavelengths. A still further possible embodiment, shown schematically in FIG. 8c, may be, e.g., a slotted or grooved multifaceted wedge 150, with right and left hand portions of the beam 118', 116' forming two beams 106'104' incident on a straight grating 120.

It will further be understood that, e.g., the embodiments of FIGS. 8a–c could be rigid, i.e., not separately rotatable, such that the separation between peaks in the beam returned from the grating would remain constant while the center wavelength of the peaks is selectable, e.g., with a further reflecting from a tunable Rmax onto the grating 120.

Another possible approach according to an aspect of an embodiment of the present invention is a stimulated optical element, e.g., an acousto-optical element 100, e.g., a Bragg cell 170 as illustrated schematically in FIGS. 1, 3, 4 and 6, for producing the ability to shift line-center on a shot-by-shot basis or even within each shot. Utilizing such a concept the RELAX spectrum can be formed by dithering the line-center, e.g., on an every-other shot basis leaving the Bragg cell un-stimulated in one pulse and stimulated in the next and so forth. Such dithering should be compatible with even the shortest exposure window currently used by lithography scanners. Alternatively it may be possible to stimulate the stimulated optical element, e.g., an acousto-optical element Bragg cell acousto-optical element at a sufficiently high rate to effectively produce within a single pulse a temporally separated plurality of spectra centered about a plurality of different center wavelengths spatially throughout the beam comprising the specific pulse, i.e., not in just a spatial top half and bottom half as discussed above. This may result in "smearing", i.e., moving through a more-or-less continuum of center wavelengths between a first center wavelength and a second center wavelength, but may be effective and may be enhanced in effectiveness, e.g., by smearing from the first to the second in one pulse and from the second to the first in another pulse, or by some hesitation in the smearing at one or more intermediate center wavelengths between the first and the second simulating on an integrated basis within the time of the pulse several center wavelength peaks including the first and second and at least one intermediate "peak." It will be understood that in such an embodiment the first and second "peaks" are not actually separate center wavelength peaks as discussed above, but the beginning and ending "peaks" in the smeared spectrum within the single pulse.

In addition, with acousto-optic line-center control there is the ability to achieve agile/nimble line-center control along with RELAX or alternatively to RELAX, e.g., when RELAX is not needed. With such control the wavelength sigma performance could be improve dramatically. Line-center chirp and vibration induced line-center variation, e.g., could be nearly eliminated with proper mechanical mounting of the Rmax and combined, e.g., mechanical and piezoelectric tilt control, which, e.g., is in the 4000 Hz range, e.g., for a 4 KHz laser system. However, the use of a stimulated optical element to dither center wavelength pulse-to-pulse or substantially pulse-to-pulse could be a significant improvement over mechanically dithering.

Figure 3:
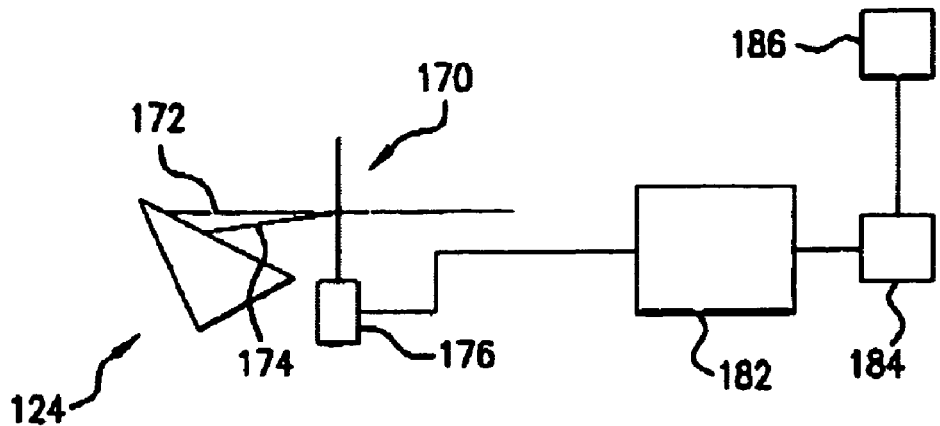
Figure 6:
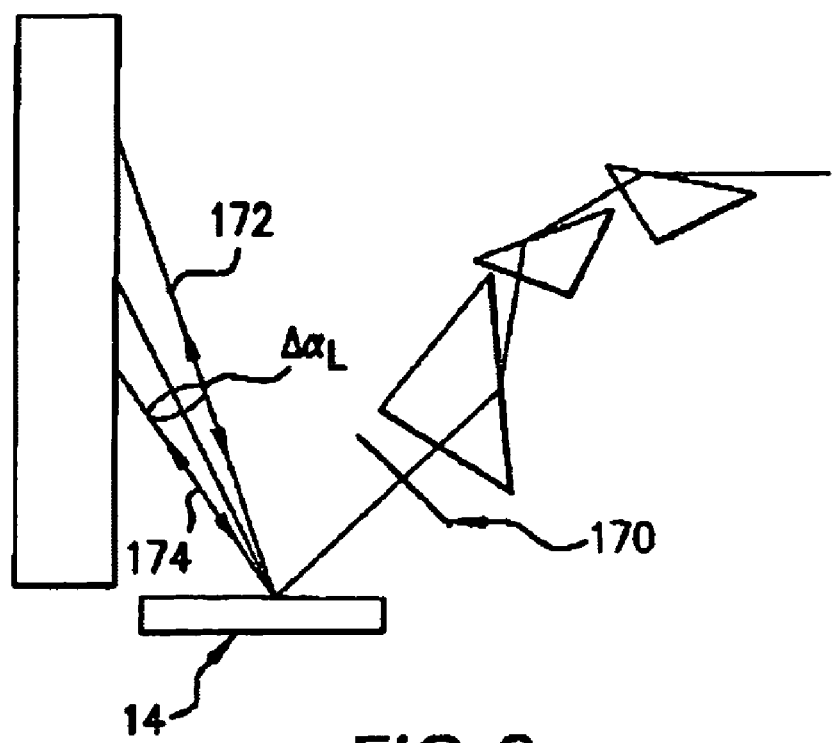
FIG. 6 shows schematically a beam deflecting system for shifting center wavelength according to aspects of an embodiment of the present invention.

By way of example, there is illustrated in FIG. 3 an acousto-optical system delivering a plurality of, e.g., two, deflected beams separated pulse-to-pulse. Each individual one of the plurality of separate deflections 172, 174, occur according to a stimulation to the optic 170, e.g., ultrasonic waves of a frequency $\omega_1$ for deflection 172 and $\omega_2$ for deflection 174. These may be supplied to a first prism in a beam expander in a configuration as illustrated schematically in FIG. 1. It will be understood that this arrangement could be essentially utilized in a variety of positions in the LNP, e.g., also as illustrated in FIG. 6, e.g., between the last prism in the beam expander 124 and the tuning mirror 14.

Figure 4:
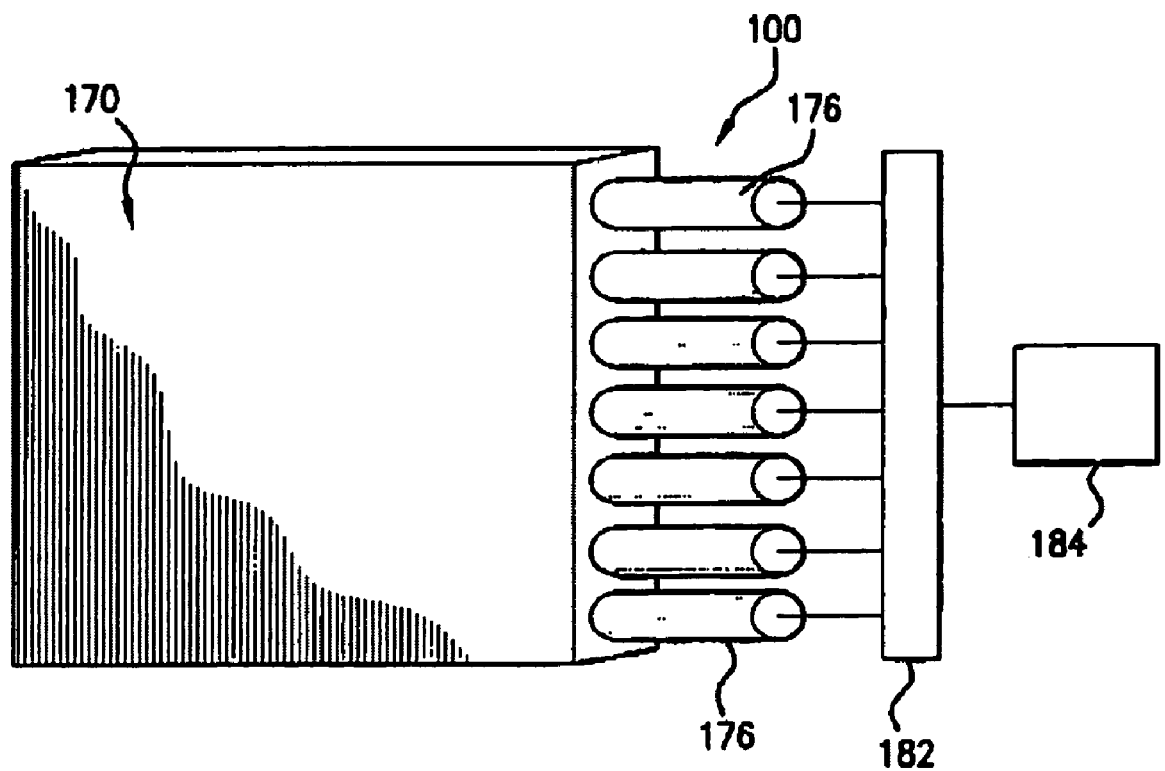
FIG. 4 shows schematically a Bragg cell beam deflector according to aspects of an embodiment of the present invention.

As illustrated, in FIGS. 3 and 4, the acousto-optical device 170 may be driven by a single ultrasonic transducer 176, or multiple transducers 176 which is in turn connected to a signal amplifier 182, driven by a voltage controlled oscillator ("VCO") 184 which in turn may be driven by signal generator 186, e.g., putting out a square wave. This may be at some frequency, e.g., at 4 KHz for a 4 KHz pulse repetition rate laser output, with the output of the VCO representing two different $\omega$s, i.e., two different deflection states for the acousto-optical element 170.

According to an aspect of an embodiment of the present invention a significant advantage to this form of wave splitting device can be the fact that it can be turned on and off essentially seamlessly to the remainder of the laser system. When it is on there are a plurality of differentially deflected beams, e.g., pulse-to-pulse, based on the number of excitation frequencies or frequency/amplitude combinations applied to the acousto-optical device 170, e.g., by the transducer 176 in response to the VCO 184, and when all excitation/stimulation of the acousto-optical device is removed only a single output beam results with the same refractive index throughout, temporally and spatially.

Figure 5A:
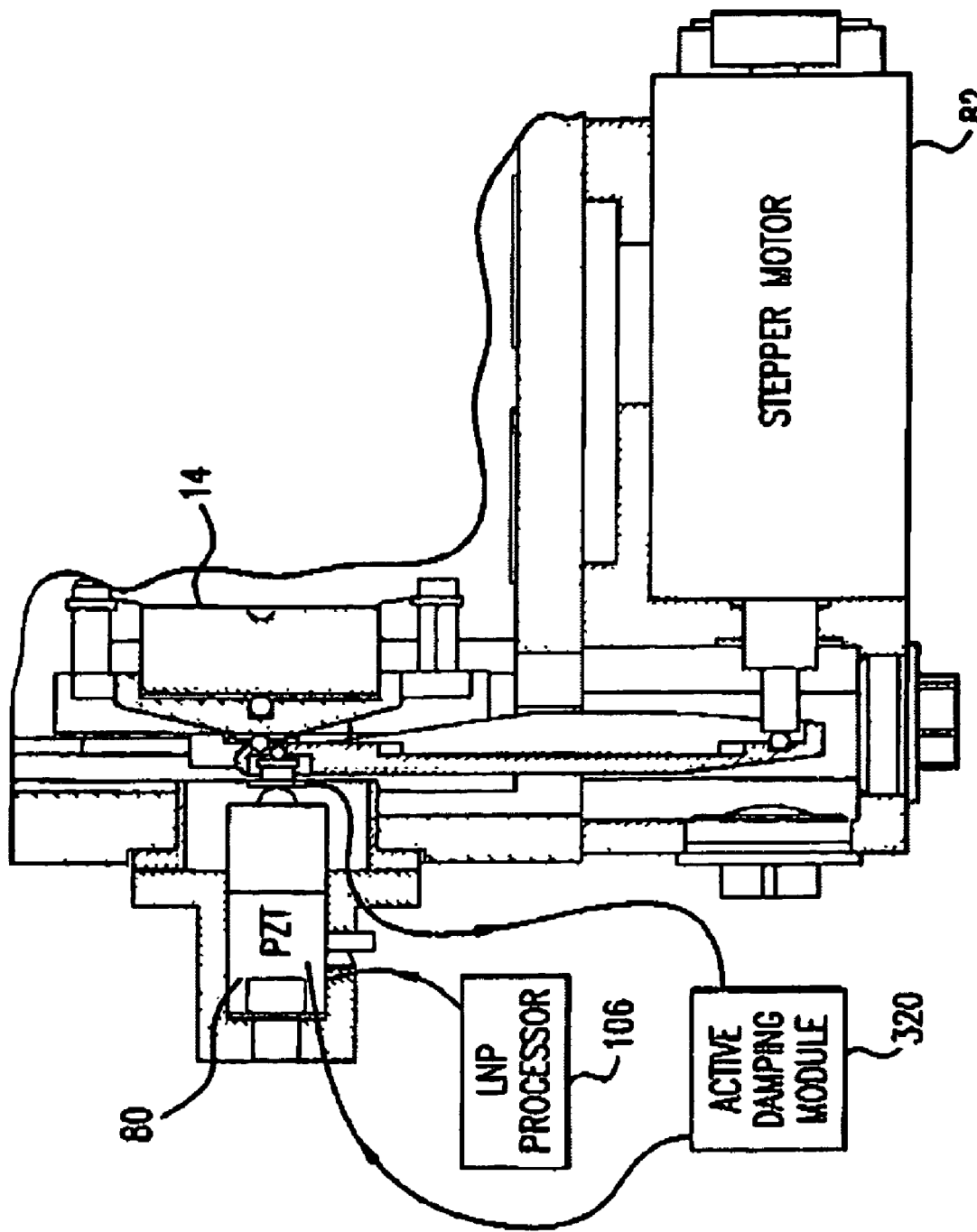

In the manner described above it will be understood that a relatively fast stepper motor 82 may, e.g., tilt the tuning mirror 14 in the direction of the arrows shown in FIG. 5 to, e.g., change the angle of incidence of light incident on the tuning mirror, e.g., from the beam expander 124 as it is incident on the grating, to tune the center wavelength of the light returning from the grating 120. The PZT driver 80, as shown in FIG. 5A, can produce even more rapid tilt changes using relatively extremely rapid changes in piezoelectric stimulations to the PZT drive ball 76 for very rapid tilt changes. Within the particular limits of the stepper motor and mechanical linkages, and the PZT drive, e.g., to susceptibilities to mechanical resonances and the like, the system just described is at least theoretically capable of at least changing the center wavelength of each selected pulse, e.g., at a pulse repetition rate of 4 KHz and above. It is certainly capable of so changing the center wavelength substantially every pulse even at 4000 Hz, e.g., every fourth pulse, so that integrated over a series of pulses the virtual effect is of a pulse-to-pulse change so far as the operation of an integrated circuit lithography tool is concerned.

The grating 120 may have a bending mechanism 78, e.g., for beam quality control, e.g., by adjusting the face of the grating according to the wavefront of incident light, and the grating bending mechanism may, e.g., be external driven, e.g., by a stepper motor for active BCD. The LNP components may have improvements as discussed in the co-pending application Ser. No. 10/808,157, entitled DUV LIGHT SOURCE OPTICAL ELEMENT IMPROVEMENTS, filed on Mar. 23, 2004, the disclosure of which is hereby incorporated by reference.

A still further possibility contemplated by the applicants can be to spatially separate the beam into a plurality of separate portions and dither those on a pulse-to-pulse basis, i.e., vary the selected center wavelength for each spatial portion of the pulse for each pulse or substantially each pulse or the temporally dither the respective plurality of spatially separated beam portions within each given pulse, and to combine the two by varying the temporal dithering of the respective spatial portions of each pulse on a pulse to pulse basis.

Figure 12:
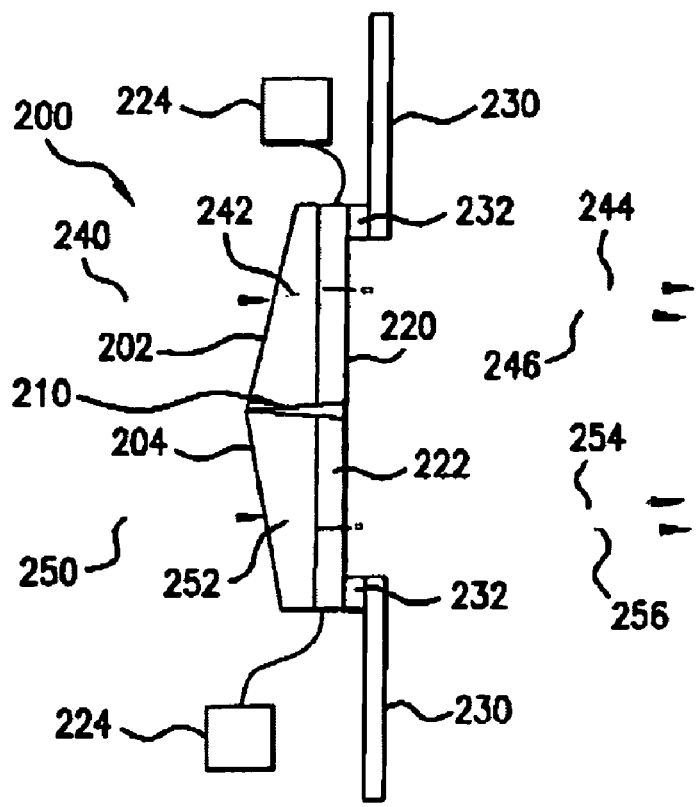
FIG. 12 shows schematically aspects of an alternative embodiment of the present invention.

Turning now to FIG. 12 there is shown schematically aspects of an embodiment of the present invention which comprises a split beam RELAX system 200. The system 200 may include a pair of wedges 202, 204 placed in spatially separated portions of the laser pulse beam containing, e.g., rays 240, 250. The wedges 202, 204 may be backed by respective stimulated optical elements, e.g., acousto-optical elements 220, 222. Each of the wedges 202, 204 may be separately tilted by a respective tuning mechanism the lever arms 230 and piezoelectric drivers 232. The separate tilting of each wedge may be facilitated, in the case, e.g., where the two wedges are formed from a single piece of optical material, e.g., $CaF_2$ or $MgF_2$, by a groove or slot 210 cut into the back of the piece of material forming wedges 202, 204, leaving an unbroken front facing surface receiving the rays 240, 250. Each of the stimulated optical elements 220, 222 may b driven by a respective driver 224.

It will be understood that in operation the system 200 of FIG. 12 may receive rays 240, 250 on the receiving surfaces of the respective wedge portions 202, 204, which are refracted in the respective wedge 202, 204, as illustrated at 242, 252 according to the angle if incidence of the respective rays 240, 250 as determined by the separately driven assemblies containing each of the wedge/stimulated optical element assemblies 202, 220 and 204, 222, and then are modulated in the respective stimulated optical elements, 220, 222 to form, e.g., two separate pairs of emerging rays 244, 246 and 254, 256, which may then, e.g., be incident upon a grating (not shown in FIG. 12). This may b driven to occur on a pulse-by-pulse basis. The assemblies 202, 220 and 204, 222 may be driven on a less than pulse-by-pulse basis, e.g., every other pulse or every fourth pulse, while the stimulated optical elements 220, 222 may be driven on a pulse-by-pulse basis or other possible combinations of these. In addition the stimulated optical elements may be smeared between a plurality of output rays 244, 246 and/or 254, 256 within a single pulse in combination with any dithering of the assemblies 202, 220 and 204, 222 that is selected. In addition, it will be understood that in operation the stimulated optical elements may be modulated in the same or different ways pulse-to-pulse or within a respective pulse.

Figure 13:
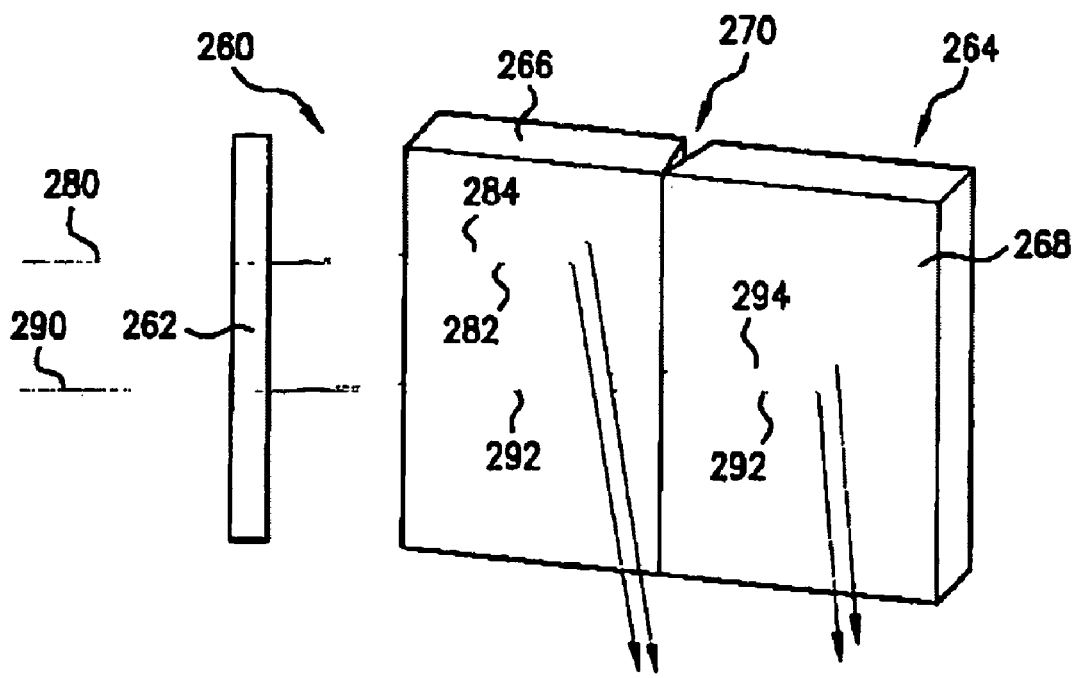
FIG. 13 shows schematically aspects of an alternative embodiment of the present invention.

Turning now to FIG. 13, there is shown according to aspects of an embodiment of the present invention an alternative arrangement for a split beam RELAX system 260 operable in much the same way as the system of FIG. 12. The system 260 may comprise a stimulated optical element, e.g., an electro- or acousto-optical element 262 which may be in the path of a laser pulse beam containing, e.g., rays 280 and 290 that are modulated to form the output of the stimulated optical element, respectively 282, 284 and 292, 294, which may be incident on a split/bent Rmax 264, as discussed above with respect to, e.g., FIGS. 7(d) and 8(a). This can result as will be understood in two sets of rays 282, 284 and 292, 294 differentially reflected by the right side portion 268 and left side portion 266 of the split/bent Rmax 264, and hinged by notch 270, which may each be separately driven, as discussed above, e.g., by electro-mechanical and piezoelectric drivers (not shown in FIG. 13), onto a grating (not shown in FIG. 13). The different pulse-to-pulse and intra-pulse possibilities for split beam combined with stimulated optical element modulation discussed with respect to FIG. 12 will be understood to be available with the utilization of a system 160 according to aspects of the embodiment shown in FIG. 13.

Those skilled in the art will appreciate that there are many changes and modifications that may be made to the aspects of embodiments of the invention disclosed in this application without departing from the scope and spirit of the claims and the appended claims should not be considered to be limited to the aspects of embodiments of the present invention disclosed in this application. For example, future technologies may more readily facilitate such things as more rapid modification of the angle of incidence of the beam upon, e.g., the grating to facilitate, e.g., temporally spacing within a single pulse a plurality of different center wavelength spectra. Combinations of the above referenced techniques for spatially splitting the beam into spatial portions with different center wavelengths that are not mentioned in this application may still be combined as those skilled in the art should appreciate from the teachings of the present application and should not be excluded from the scope and spirit of the appended claims. Also by way of example, a tilting mechanism may be a general tilting mechanism for all of a plurality of elements on a single mount, i.e., by tilting the entire mount, while the mount may also include the capability of having one or more elements tilted in relation to the mount and these differing tilting mechanisms may be used differently, e.g., from pulse to pulse over time. Tilting should also be understood as generic to any form of deflection of the beam of pulses or portions of the beam separated spatially, e.g., in cross section, e.g., various stimulated optics discussed above upon which some or all of the beam is incident and including in combination with other portions of the beam separated in space or time, within a pulse or pulse to pulse, and including in combination with such other elements that are not stimulated optical elements. All of the above can serve the desired effect of separating an incident beam of pulses of laser light into spatially and/or temporally or both spatially and temporally separated portions incident on, e.g., a dispersive wavelength selection optic, e.g., a grating to return a beam with pulses that have spatially or temporally or spatially and temporally separated portions pulse to pulse and/or within a pulse. This light is then ultimately delivered to an integrated circuit lithography tool with different spectral peaks within each pulse or pulse to pulse, e.g., for improving DOF capabilities. Similarly placing or positioning a tuning element, e.g., an optic, in one or more of a plurality of positions to cause differential reflection or other transmission angles to be incident on the dispersive wavelength selection element, e.g., a grating, should be interpreted generically to include such deflection by, e.g., stimulated optical elements, e.g., acousto-optical elements.

It will be further understood from the above that incidence angle selection means may be utilized to dither between a plurality of selected center wavelength spectra on a pulse-to-pulse basis. This may be done, e.g., by using a tuning mechanism having at least a first portion differentially displaceable from at lease a second portion and modifying the differential displacement between the two or the tilt angle of the assembly holding the two on a pulse-to-pulse basis. It is possible also to dither, rather smear, from one selected center wavelength to at least one other center wavelength during the temporal duration of a given pulse, which may be done, e.g., using a stimulated optical element that flips or snaps between a first $\theta$ and a second $\theta$ or continuously modulates between a first $\theta$ and a second $\theta$ during the temporal duration of the pulse. It is also possible to select a spatially defined portion of the pulse containing beam to contain a selected center wavelength spectra and at least one other spatially defined portion of the pulse containing beam to have a second center wavelength spectra, or combinations of these. This may be done by In this manner, e.g., the output laser light pulse beam may contain a first pulse with a first center wavelength spectra and at least a second pulse with a second selected center wavelength spectra, or may contain a plurality of pulses each with two selected center wavelength spectra, or may contain a first pulse with a first pair of selected center wavelength spectra and at lease a second pulse with a second pair of selected wavelength spectra in which one or more of the selected wavelengths differ in the at least a second pulse from those in the first pulse. It is likewise possible to create at least one pulse in which the selected center wavelength for the entire spatial distribution of the pulse is varied (smeared) during the temporal distribution of the pulse, either in a continuous fashion from a first selected center wavelength to a second selected center wavelength or with at least one hesitation along the way, e.g., to give an integrated spectrum over the respective pulse which appears to have at least one peak between the first and second center wavelengths. In addition, variations and combinations of the above can be generated from pulse to pulse. For example it is possible to create pulses with a plurality of spatially distributed portions of each pulse that dither from pulse to pulse between a plurality of center wavelengths, or that smear during a pulse, e.g., in the same or different directions (increasing center wavelength or decreasing center wavelength), and/or between different center wavelengths, and that smear between different center wavelengths in at least a second pulse in the same or different directions or some in the same and some in different directions.

We claim:

1. A narrow band short pulse duration gas discharge laser output light pulse beam producing system, producing a beam comprising laser output light pulses at a selected pulse repetition rate, comprising:

a dispersive bandwidth selection optic selecting at least one center wavelength for each pulse determined at least in part by the angle of incidence of the laser light pulse beam containing the respective pulse on the dispersive wavelength selection optic;

a tuning mechanism operative to select at least one angle of incidence of the a laser light pulse beam containing the respective pulse upon the dispersive center wavelength selection optic;

the tuning mechanism comprising a plurality of incidence angle selection elements each defining an angle of incidence for a different spatially separated but not temporally separated portion of the laser light pulse to return from the dispersive center wavelength selection optic a laser light pulse comprising a plurality of spatially separated but not temporally separated portions, each portion having one of at least two different selected center wavelengths.

2. The apparatus of claim 1 further comprising:
the tuning mechanism comprises an electromechanical selecting mechanism that selects the respective angles of incidence for each spatially separated but not temporally separated portion of the pulse.

3. The apparatus of claim 1 further comprising:
the tuning mechanism comprises a piezoelectric selecting mechanism that selects the respective angles of incidence for each spatially separated but not temporally separated portion of the pulse.

4. The apparatus of claim 1 further comprising:
the tuning mechanism comprises an electromechanical and a piezoelectric selecting mechanism that selects the respective angles of incidence for each spatially separated but not temporally separated portion of the pulse.

5. The apparatus of claim 1 further comprising:
the tuning mechanism comprises a plurality of non-stimulated optical incidence angle selection elements that are differentially displaceable with respect to each other across a cross-sectional profile of the beam and remain in a selected differentially displaced alignment for the duration of at least one pulse.

6. The apparatus of claim 2 further comprising:
the tuning mechanism comprises a plurality of non-stimulated optical incidence angle selection elements that are differentially displaceable with respect to each other across a cross-sectional profile of the beam and remain in a selected differentially displaced alignment for the duration of at least one pulse.

7. The apparatus of claim 3 further comprising:
the tuning mechanism comprises a plurality of non-stimulated optical incidence angle selection elements that are differentially displaceable with respect to each other across a cross-sectional profile of the beam and remain in a selected differentially displaced alignment for the duration afar least one pulse.

8. The apparatus of claim 4 further comprising:
the tuning mechanism comprises a plurality of non-stimulated optical incidence angle selection elements that are differentially displaceable with respect to each other across a cross-sectional profile of the beam and remain in a selected differentially displaced alignment for the duration of at least one pulse.

9. The apparatus of claim 1 further comprising:
the tuning mechanism comprises:
a first selection element positioned by a first tilting mechanism for the duration of at least one pulse; and
a second selection element positioned by a second tilting mechanism for the duration of the at least one pulse.

10. The apparatus of claim 2 further comprising:
the tuning mechanism comprises:
a first selection element positioned by a first tilting mechanism for the duration of at least one pulse; and
a second selection element positioned by a second tilting mechanism for the duration of the at least one pulse.

11. The apparatus of claim 3 further comprising:
the tuning mechanism comprises:
a first selection element positioned by a first tilting mechanism for the duration of at least one pulse; and
a second selection element positioned by a second tilting mechanism for the duration of the at least one pulse.

12. The apparatus of claim 4 further comprising:
the tuning mechanism comprises:
a first selection element positioned by a first tilting mechanism for the duration of at least one pulse; and
a second selection element positioned by a second tilting mechanism for the duration of the at least one pulse.

13. The apparatus of claim 9 further comprising:
one of the first and second tilting mechanisms is a stationary mounting.

14. The apparatus of claim 10 further comprising:
one of the first and second tilting mechanisms is a stationary mounting.

15. The apparatus of claim 11 further comprising: one of the first and second tilting mechanisms is a stationary mounting.

16. The apparatus of claim 12 further comprising:
one of the first and second tilting mechanisms is a stationary mounting.

17. The apparatus of claim 1 further comprising:
at least one of the incidence angle selection mechanisms comprises a stimulated optical element.

18. The apparatus of claim 17 further comprising:
the stimulated optical element is an acousto-optical element.

19. The apparatus of claim 18 further comprising:
the stimulated optical element is an electro-optical element.

20. A narrow band short pulse duration gas discharge laser output light pulse beam producing system, producing a beam comprising laser output light pulses at a selected pulse repetition rat, comprising:
a dispersive bandwidth selection optic selecting at least one bandwidth for each pulse centered at a selected center wavelength determined at least in part by the angle of incidence of the laser light pulse beam containing the respective pulse on the dispersive bandwidth selection optic;

a tuning mechanism operative to select at least two angles of incidence of the laser light pulse beam containing the respective pulse upon the dispersive bandwidth selection optic;

the tuning mechanism comprising a temporal angle of incidence selection element defining an angle of incidence for different temporally separated portions of the pulse to return from the dispersive bandwidth selection optic a laser beam comprising a plurality of temporally separated portions of each pulse, each temporally separated portion of each pulse having one of at least two different selected center wavelengths.

21. The apparatus of claim 20 further comprising:
the tuning mechanism comprises a stimulated optical element that selects each of the plurality of angles of incidence for each selected center wavelength.

22. The apparatus of claim 21 further comprising:
the stimulated optical element is an acousto-optical element.

23. The apparatus of claim 21 further comprising:
the stimulated optical element is an electro-optical element.

24. A narrow band short pulse duration gas discharge laser output light pulse beam producing system, producing laser output light pulses at a selected pulse repetition rate, comprising:
a dispersive bandwidth selection optic selecting at least one bandwidth for each pulse centered at a selected center wavelength determined at least in part by the angle of incidence of the output laser light pulse beam containing the respective pulse on the dispersive bandwidth selection optic;
a tuning mechanism operative to select at least two angles of incidence of the output laser light pulse beam containing the respective pulse upon the dispersive bandwidth selection optic;
the tuning mechanism comprising:
a plurality of spatial incidence angle selection elements each defining an angle of incidence for a spatially separated but not temporally separated portion of the laser light pulse, and
a plurality of temporal angle of incidence selection elements each defining at least a first angle of incidence for at least a first temporally separated portion of each spatially separated but not temporally separated portion of the pulse and a second angle of incidence for a second temporally separated but not spatially separated portion of each spatially separated portion of the pulse.

25. The apparatus of claim 24 further comprising:
the tuning mechanism comprises an electromechanical selecting mechanism.

26. The apparatus of claim 24 further comprising:
the tuning mechanism comprises a piezoelectric selecting mechanism.

27. The apparatus of claim 24 further comprising:
the tuning mechanism comprises an electromechanical and a piezoelectric selecting mechanism.

28. The apparatus of claim 24 further comprising:
the tuning mechanism comprises a stimulated optical element selecting mechanism.

29. The apparatus of claim 28 further comprising:
the stimulated optical element comprises an acousto-optical element.

30. The apparatus of claim 28 further comprising:
the stimulated optical element is an electro-optical element.

31. The apparatus of claim 24 further comprising
the tuning mechanism comprises:
a first selection element assembly positioned by a first tilting mechanism for the duration of at least one pulse; and
a second selection element assembly positioned by a second tilting mechanism for the duration of the at least one pulse.

32. The apparatus of claim 25 further comprising
the tuning mechanism comprises:
a first selection element assembly positioned by a first tilting mechanism for the duration of at least one pulse; and
a second selection element assembly positioned by a second tilting mechanism for the duration of the at least one pulse.

33. The apparatus of claim 26 further comprising
the tuning mechanism comprises:
a first selection element assembly positioned by a first tilting mechanism for the duration of at least one pulse; and
a second selection element assembly positioned by a second tilting mechanism for the duration of the at least one pulse.

34. The apparatus of claim 27 further comprising
the tuning mechanism comprises:
a first selection element assembly positioned by a first tilting mechanism for the duration of at least one pulse; and
a second selection element assembly positioned by a second tilting mechanism for the duration of the at least one pulse.

35. The apparatus of claim 28 further comprising
the tuning mechanism comprises:
a first selection element assembly positioned by a first tilting mechanism for the duration of at least one pulse; and
a second selection element assembly positioned by a second tilting mechanism for the duration of the at least one pulse.

36. The apparatus of claim 31 comprising:
the first selection element assembly comprises a spatial incidence angle selection element and a temporal incidence angle selection element; and
the second selection element assembly comprises a spatial incidence angle selection element and a temporal incidence angle selection element.

37. The apparatus of claim 32 comprising:
the first selection element assembly comprises a spatial incidence angle selection element and a temporal incidence angle selection element; and
the second selection element assembly comprises a spatial incidence angle selection element and a temporal incidence angle selection element.

38. The apparatus of claim 33 comprising:
the first selection element assembly comprises a spatial incidence angle selection element and a temporal incidence angle selection element; and
the second selection element assembly comprises a spatial incidence angle selection element and a temporal incidence angle selection element.

39. The apparatus of claim 34 comprising:
the first selection element assembly comprises a spatial incidence angle selection element and a temporal incidence angle selection element; and
the second selection element assembly comprises a spatial incidence angle selection element and a temporal incidence angle selection element.

40. The apparatus of claim 1 further comprising:
the tuning mechanism defining different angles of incidence for different pulses within a series of pulses to return from the dispersive bandwidth selection optic a laser beam comprising a plurality of pulses, individual pulses having a selected bandwidth containing a respective one of at least two different center wavelengths to produce within the series of pulses an integrated effect of a laser pulse beam containing at least two center wavelength spectra.

41. The apparatus of claim 20 further comprising:
the tuning mechanism defining different angles of incidence for different pulses within a series of pulses to return from the dispersive bandwidth selection optic a laser beam comprising a plurality of pulses, individual pulses having a selected bandwidth containing a respective one of at least two different center wavelengths to produce within the series of pulses an integrated effect of a laser pulse beam containing at least two center wavelength spectra.

42. The apparatus of claim 24 further comprising:
the tuning mechanism defining different angles of incidence for different pulses within a series of pulses to return from the dispersive bandwidth selection optic a laser beam comprising a plurality of pulses, individual pulses having a selected bandwidth containing a respective one of at least two different center wavelengths to produce within the series of pulses an integrated effect of a laser pulse beam containing at least two center wavelength spectra.

43. The apparatus of claim 1 further comprising:
the tuning mechanism comprises a differentially bendable reflector comprising at least a first reflector portion and a second reflector portion, with the angle of incidence on the wavelength selection optic defined separately for each of the at least a first reflector portion and a second reflector portion.

44. The apparatus of claim 20 further comprising:
the tuning mechanism comprises a differentially bendable reflector comprising at least a first reflector portion and a second reflector portion, with the angle of incidence on the wavelength selection optic defined separately for each of the at least a first reflector portion and a second reflector portion.

45. The apparatus of claim 24 further comprising:
the tuning mechanism comprises a differentially bendable reflector comprising at least a first reflector portion and a second reflector portion, with the angle of incidence on the wavelength selection optic defined separately for each of the at least a first reflector portion and a second reflector portion.

46. The apparatus of claim 43 further comprising:
the tuning mechanism comprises a split reflector comprising a reflector optic with a grove formed in it dividing it into at lease first portion and a second portion, with the angle of incidence on the wavelength selection optic defined separately for each of the at least a first portion and a second portion.

47. The apparatus of claim 44 further comprising:
the tuning mechanism comprises a split reflector comprising a reflector optic with a grove formed in it dividing it into at lease first portion and a second portion, with the angle of incidence on the wavelength selection optic defined separately for each of the at least a first portion and a second portion.

48. The apparatus of claim 45 further comprising:
the tuning mechanism comprises a split reflector comprising a reflector optic with a grove formed in it dividing it into at lease first portion and a second portion, with the angle of incidence on the wavelength selection optic defined separately for each of the at least a first portion and a second portion.

49. The apparatus of claim 18 further comprising:
the acousto-optical element comprises a phased array or stimulating sonic wave transducers.

50. The apparatus of claim 22 further comprising:
the acousto-optical element comprises a phased array of stimulating sonic wave transducers.

51. The apparatus of claim 29 further comprising:
the acousto-optical element comprises a phased array of stimulating sonic wave transducers.

52. The apparatus of claim 49 further comprising:
the phased array of stimulating ultrasonic transducers comprises a frequency slipping mechanism.

53. The apparatus of claim 50 further comprising:
the phased array of stimulating ultrasonic transducers comprises a frequency slipping mechanism.

54. The apparatus of claim 51 further comprising:
the phased array of stimulating ultrasonic transducers comprises a frequency slipping mechanism.

55. The apparatus of claim 1, further comprising:
the tuning mechanism comprising a plurality of incidence angle selection elements each defining an angle of incidence for a different spatially separated but not temporally separated portion of the laser light pulse comprising a differentially bendable grating containing at least a first section and a second section to return from the first and second sections of the dispersive center wavelength selection optic a laser light pulse comprising a plurality of spatially separated but not temporally separated portions, each portion having one of at least two different selected center wavelengths.

56. The apparatus of claim 1 further comprising:
the tuning mechanism defining at least a first angle of incidence for a first spatially separated but not temporally separated portion of a first laser light pulse and a second angle of incidence for a second spatially separated but not temporally separated portion of the first laser light pulse to return from the dispersive center wavelength selection optic a first laser light pulse comprising at least the first and second spatially separated but not temporally separated portions, each of the at least a first and a second portion having one of at least two different selected center wavelengths, and defining at least a third angle of incidence for a first spatially separated but not temporally separated portion of a second laser light pulse and a fourth angle of incidence for a second spatially separated but not temporally separated portion of the second laser light pulse to return from the dispersive center wavelength selection optic a second laser light pulse comprising at least a first and second portion having one of at least two different selected center wavelengths, with at least one of the first and second selected center wavelengths in the first pulse being different from the respective first or the respective second selected center wavelengths in the second pulse.

57. The apparatus of claim 56 further comprising:
the tuning mechanism comprising means for maintaining the central wavelength intermediate the first and second center wavelengths in the first pulse equal to the central wavelength intermediate the first and second center wavelengths in the second pulse.

58. The apparatus of claim 20 further comprising:
the tuning mechanism defining at least a first angle of incidence for a first temporally separated portion of a first laser light pulse and a second angle of incidence for a second temporally separated portion of the first laser light pulse to return from the dispersive center wavelength selection optic a first laser light pulse comprising at least the first and second temporally separated portions, each of the at least a first and a second portion having one of at least two different selected center wavelengths, and defining at least a third angle of incidence for a first temporally separated portion of a second laser light pulse and a fourth angle of incidence for a second temporally separated portion of the second laser light pulse to return from the dispersive center wavelength selection optic a second laser light pulse comprising at least a first and second portion having one of at least two different selected center wavelengths, with at least one of the first and second selected center wavelengths in the first pulse being different from the respective first or the respective second selected center wavelengths in the second pulse.

59. The apparatus of claim 58 further comprising:
the tuning mechanism comprising means for maintaining the central wavelength intermediate the first and second center wavelengths in the first pulse equal to the central wavelength intermediate the first and second center wavelengths in the second pulse.

60. The apparatus of claim 24 further comprising:
the tuning mechanism defining at least a first angle and a second angle of incidence for a first spatially separated portion of a first laser light pulse, with the first and second angle of incidence being temporally separated within the first spatially separated portion of the first laser output pulse and a third and fourth angle of incidence for a second spatially separated portion of the first laser light pulse, with the third and fourth angle of incidence being temporally separated within the second spatially separated portion of the first laser light pulse, and
the tuning mechanism defining at least a first angle and a second angle of incidence for a first spatially separated portion of a second laser light pulse, with the first and second angle of incidence being temporally separated within the first spatially separated portion of the second laser output pulse and a third and fourth angle of incidence for a second spatially separated portion of the second laser light pulse, with the third and fourth angle of incidence being temporally separated within the second spatially separated portion of the second laser light pulse.

61. The apparatus of claim 60 further comprising:
the tuning mechanism comprising means for maintaining the central wavelength intermediate the first and second temporally separated center wavelengths in the first spatially separated portion of the laser light pulse and the central wavelength intermediate the first and second temporally separated wavelengths in the second spatially separated portion of the first pulse equal to the respective central wavelengths in the second laser light pulse.

62. A narrow band short pulse duration gas discharge laser output light pulse beam producing method, producing a beam comprising laser output light pulses at a selected pulse repetition rate, comprising
using a dispersive bandwidth selection optic, selecting at least one center wavelength for each pulse determined at least in part by the angle of incidence of the output laser light pulse beam containing the respective pulse on the dispersive wavelength selection optic;
using a tuning mechanism, selecting at least one angle of incidence of the output laser light pulse beam containing the respective pulse upon the dispersive center wavelength selection optic;
using the tuning mechanism comprising a plurality of portions, defining different angles of incidence for different spatially separated but not temporally separated portions of the laser beam to return from the dispersive center wavelength selection optic a laser beam comprising a plurality of spatially separated but nor temporally separated portions of each pulse, each having one of at least two different selected center wavelengths.

63. A narrow band short pulse duration gas discharge laser output light pulse beam producing method, producing a beam comprising laser output light pulses at a selected pulse repetition rat, comprising:
using a dispersive bandwidth selection optic, selecting at least one bandwidth for each pulse centered at a selected center wavelength determined at least in part by the angle of incidence of the output laser light pulse beam containing the respective pulse on the dispersive bandwidth selection optic;
using a tuning mechanism, selecting at least two angles of incidence of the output laser light pulse beam containing the respective pulse upon the dispersive bandwidth selection optic;
using the tuning mechanism, defining an angle of incidence for different temporally separated portions of the pulse to retain from the dispersive bandwidth selection optic a laser beam comprising a plurality of temporally separated portions of each pulse, each temporally separated portion of each pulse having one of at least two different selected center wavelengths.

64. A narrow band short pulse duration gas discharge laser output light pulse beam producing method, producing laser output light pulses at a selected pulse repetition rate, comprising:
using a dispersive bandwidth selection optic, selecting at least one bandwidth for each pulse centered at a selected center wavelength determined at least in part by the angle of incidence of the output laser light pulse beam containing the respective pulse on the dispersive bandwidth selection optic;
using a tuning mechanism, selecting at least two angles of incidence of the output laser light pulse beam containing the respective pulse upon the dispersive bandwidth selection optic;
the selecting step using the tuning mechanism comprising:
using a plurality of spatial incidence angle selection elements, defining an angle of incidence for a spatially separated but not temporally separated portion of the laser light pulse, and
using a plurality of temporal angle of incidence selection elements, defining at least a first angle of incidence for at least a first temporally separated portion of each spatially separated but not temporally separated portion of the pulse and a second angle of incidence for a second temporally separated but not spatially separated portion of each spatially separated portion of the pulse.

* * * * *